United States Patent
Tabei

(10) Patent No.: US 8,648,479 B2
(45) Date of Patent: Feb. 11, 2014

(54) EPOXY RESIN COMPOSITION FOR SEMICONDUCTOR ENCAPSULANT AND SEMICONDUCTOR DEVICE USING THE SAME

(75) Inventor: Jun-ichi Tabei, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/698,462

(22) PCT Filed: May 25, 2011

(86) PCT No.: PCT/JP2011/002906
§ 371 (c)(1),
(2), (4) Date: Nov. 16, 2012

(87) PCT Pub. No.: WO2011/148628
PCT Pub. Date: Dec. 1, 2011

(65) Prior Publication Data
US 2013/0062748 A1    Mar. 14, 2013

(30) Foreign Application Priority Data
May 28, 2010   (JP) ................................ 2010-122191

(51) Int. Cl.
*H01L 23/28* (2006.01)
*H01L 23/29* (2006.01)
*H01L 23/58* (2006.01)

(52) U.S. Cl.
USPC ........... 257/787; 257/632; 257/788; 257/789; 257/795; 257/E23.116; 257/E23.117; 257/E23.121

(58) Field of Classification Search
USPC .......... 257/632, 787, 788, 789, 795, E23.116, 257/E23.117, E23.121
See application file for complete search history.

(56) References Cited

U.S. PATENT DOCUMENTS

| | | | |
|---|---|---|---|
| 5,612,444 A | 3/1997 | Cai et al. | |
| 6,140,458 A | 10/2000 | Terado et al. | |
| 6,617,701 B2 * | 9/2003 | Tanaka et al. | 257/789 |
| 7,262,514 B2 * | 8/2007 | Yoshikawa et al. | 257/793 |
| 7,846,998 B2 * | 12/2010 | Akagi et al. | 523/427 |
| 2004/0007769 A1 * | 1/2004 | Takahashi et al. | 257/678 |
| 2004/0217489 A1 * | 11/2004 | Umeno et al. | 257/787 |
| 2006/0022356 A1 * | 2/2006 | Uwada et al. | 257/787 |
| 2006/0157872 A1 * | 7/2006 | Kotani et al. | 257/787 |
| 2006/0189721 A1 * | 8/2006 | Akiyama et al. | 523/400 |
| 2007/0181902 A1 * | 8/2007 | Uchida et al. | 257/100 |
| 2009/0267239 A1 * | 10/2009 | Kanada et al. | 257/787 |
| 2011/0147954 A1 * | 6/2011 | Kitamura | 257/789 |

FOREIGN PATENT DOCUMENTS

| | | |
|---|---|---|
| JP | 9-20821 A | 1/1997 |
| JP | 2001-247748 A | 9/2001 |
| JP | 2002-53649 A | 2/2002 |
| JP | 2003-64239 A | 3/2003 |
| JP | 2005-298647 A | 10/2005 |
| JP | 2005-325159 A | 11/2005 |
| JP | 2006-182913 A | 7/2006 |
| JP | 3976386 B2 | 9/2007 |
| JP | 4010176 B2 | 11/2007 |
| JP | 2008-156665 A | 7/2008 |

OTHER PUBLICATIONS

International Search Report issued in PCT/JP2011/002906 mailed Jul. 5, 2011.

\* cited by examiner

*Primary Examiner* — Ida M Soward
(74) *Attorney, Agent, or Firm* — Birch, Stewart, Kolasch & Birch, LLP

(57) ABSTRACT

According to the present invention, an epoxy resin composition for semiconductor encapsulant including (A) an epoxy resin, (B) a curing agent, (C) an inorganic filler, and (D) a compound in which a copolymer of a 1-alkene having 5 to 80 carbon atoms and maleic anhydride is esterified with an alcohol having 5 to 25 carbon atoms in the presence of a compound represented by General Formula (1), wherein $R^1$ in General Formula (1) is selected from the group consisting of an alkyl group having 1 to 5 carbon atoms, a halogenated alkyl group having 1 to 5 carbon atoms, and an aromatic group having 6 to 10 carbon atoms is provided.

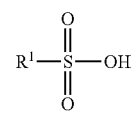

(1)

14 Claims, 1 Drawing Sheet

US 8,648,479 B2

EPOXY RESIN COMPOSITION FOR SEMICONDUCTOR ENCAPSULANT AND SEMICONDUCTOR DEVICE USING THE SAME

TECHNICAL FIELD

The present invention relates to an epoxy resin composition for semiconductor encapsulant and a semiconductor device. In particular, the present invention relates to an epoxy resin composition for semiconductor encapsulant with excellent adhesion to copper in which oxidation has progressed and an excellent mold releasing property from a mold when a lead frame made of copper is used, and a semiconductor device using the epoxy resin composition for semiconductor encapsulant.

BACKGROUND ART

In an assembly process of a semiconductor device (hereinafter, also referred to as a "package"), a method in which a bonding wire is electrically connected by thermocompressing between an aluminum electrode of an element (hereinafter, also referred to as a "chip") and an inner lead of a lead frame, is currently the mainstream. In recent years, high integration and a trend toward multi-pin electronic components have been proceeding every year with market trends for a miniaturization, weight reduction, and improved performance of electronic devices. Therefore, more complex wire bonding processes are required than before, and oxidation of a copper surface is more progressed when a lead frame made of copper is used since the lead frame made of copper is exposed for a long time at high temperatures of 200 to 250° C.

Under these circumstances, even an encapsulating material with excellent adhesion to unoxidized copper surface in the related art has poor adhesion to copper of which a surface is oxidized differently in many cases, resulting in problems such that separation occurs at the interface between an encapsulating resin cured substance and a lead frame at a time of die-cutting after resin encapsulant molding or solder reflowing.

Improving adhesion between an inserted substance such as a lead frame and an encapsulating resin cured substance in order to suppress the separation conflicts with improving mold releasing property to a mold of the encapsulating resin cured substance, therefore, there have been problems such that moldability is reduced when the adhesion to the inserted substance such as a lead frame is improved since a mold releasing property from the mold is deteriorated.

Before oxidation of a lead frame made of copper due to the high integration of electronic components becomes a problem, a method in which oxidized polyethylene wax, and a compound in which a copolymer of 1-alkene and maleic acid is esterified are added and used in combination as a mold releasing agent in order to balance adhesion and a mold releasing property has been proposed (for example, see Patent Documents 1 and 2). According to this method, adhesion and a mold releasing property to unoxidized copper are excellent, however, there has been a problem that adhesion of an encapsulating resin to an oxidized copper frame is reduced since oxidized polyethylene wax is used as a combination. In addition, if the compound in which a copolymer of 1-alkene and maleic anhydride is esterified is used alone, a mold releasing property is insufficient and a continuous moldability has not necessarily been sufficient in some cases.

RELATED DOCUMENT

Patent Document

[Patent Document 1] Japanese Patent No. 3975386
[Patent Document 2] Japanese Patent No. 4010176

DISCLOSURE OF THE INVENTION

The present invention has been made in view of the above described problems and provides an epoxy resin composition for semiconductor encapsulant with satisfactory adhesion to a lead frame made of copper in which oxidation has progressed and with an excellent mold releasing property and a continuous moldability, and a semiconductor device which includes an element encapsulated by this epoxy resin composition.

The inventors, after repeated intensive studies to solve the above problems, have found that the objective described above may be achieved using a compound in which a copolymer of 1-alkene and maleic anhydride is esterified with an alcohol using a specific compound as an epoxy resin composition for semiconductor encapsulant, therefore, completed the present invention.

According to the present invention, an epoxy resin composition for semiconductor encapsulant including (A) an epoxy resin, (B) a curing agent, (C) an inorganic filler, and (D) a compound in which a copolymer of 1-alkene having 5 to 80 carbon atoms and maleic anhydride is esterified with an alcohol having 5 to 25 carbon atoms in the presence of a compound represented by General Formula (1) is provided.

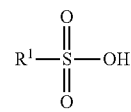

(1)

(In General Formula (1), $R^1$ is selected from the group consisting of an alkyl group having 1 to 5 carbon atoms, a halogenated alkyl group having 1 to 5 carbon atoms, and an aromatic group having 6 to 10 carbon atoms.)

According to an embodiment of the present invention, the epoxy resin composition may further include 1-alkene having 5 to 58 carbon atoms.

According to an embodiment of the present invention, in the epoxy resin composition, the amount of the 1-alkene having 5 to 58 carbon atoms may be greater than or equal to 8 parts by mass and less than or equal to 20 parts by mass with regard to 100 parts by mass of the (D) component.

According to an embodiment of the present invention, the epoxy resin composition may further include a compound represented by General Formula (2).

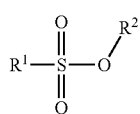

(In General Formula (2), $R^1$ is selected from the group consisting of an alkyl group having 1 to 5 carbon atoms, a halogenated alkyl group having 1 to 5 carbon atoms and an aromatic group having 6 to 10 carbon atoms, and $R^2$ represents an alkyl group having 5 to 25 carbon atoms.)

According to an embodiment of the present invention, in the epoxy resin composition, the amount of the compound represented by General Formula (2) included in the whole epoxy resin composition may be greater than or equal to 0.5 ppm and less than or equal to 100 ppm.

According to an embodiment of the present invention, in the epoxy resin composition, the compound represented by General Formula (1) may be trifluoromethanesulfonic acid.

According to an embodiment of the present invention, in the epoxy resin composition, the compound represented by General Formula (1) is a compound represented by General Formula (3).

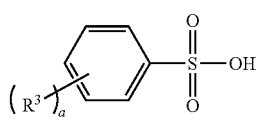

(In General Formula (3), $R^3$'s are selected from an alkyl group having 1 to 5 carbon atoms and a halogenated alkyl group having 1 to 5 carbon atoms, and may be the same as or different from each other, and a is an integer of 0 to 5.)

According to an embodiment of the present invention, in the epoxy resin composition, the compound represented by General Formula (2) may be a compound represented by General Formula (4).

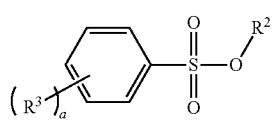

(In General Formula (4), $R^2$ represents an alkyl group having 5 to 25 carbon atoms, $R^3$'s are selected from an alkyl group having 1 to 5 carbon atoms and a halogenated alkyl group having 1 to 5 carbon atoms, and may be the same as or different from each other, and a is an integer of 0 to 5.)

According to an embodiment of the present invention, in the epoxy resin composition, the 1-alkene may be 1-alkene having 28 to 60 carbon atoms.

According to an embodiment of the present invention, in the epoxy resin composition, the alcohol may be stearyl alcohol.

According to an embodiment of the present invention, in the epoxy resin composition, (A) the epoxy resin may include at least one epoxy resin selected from the group consisting of a biphenyl-type epoxy resin represented by General Formula (5), a phenol aralkyl-type epoxy resin having a phenylene skeleton represented by General Formula (6), and a phenol aralkyl-type epoxy resin having a biphenylene skeleton represented by General Formula (7).

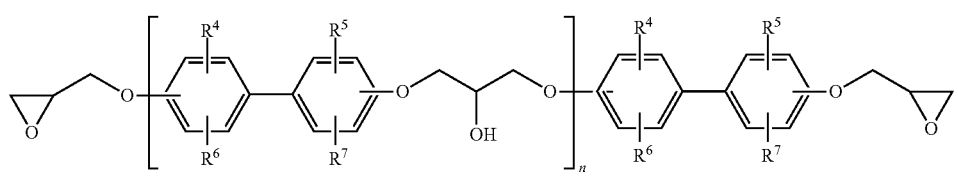

(In General Formula (5), $R^4$ to $R^7$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^4$ to $R^7$ may be the same as or different from each other, and n represents an integer of 0 to 3.)

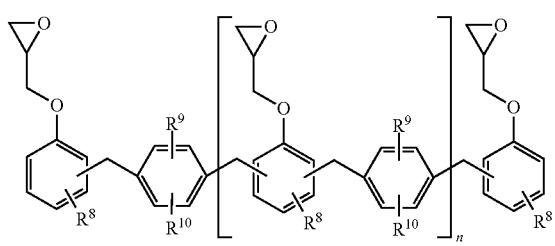

(In General Formula (6), $R^8$ to $R^{18}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^8$ to $R^{10}$ may be the same as or different from each other, and n represents an integer of 0 to 20.)

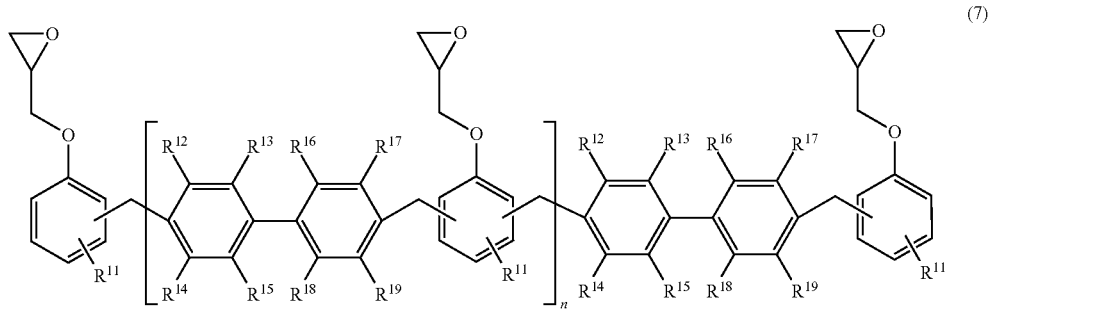

(In General Formula (7), $R^{11}$ to $R^{19}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^{11}$ to $R^{19}$ may be the same as or different from each other, and n represents an integer of 0 to 3.)

According to the present invention, a semiconductor device including a semiconductor element encapsulated by the epoxy resin composition is provided.

According to another embodiment of the present invention, in the semiconductor device, the semiconductor element may be mounted on a die pad of a lead frame made of copper, and an electrode pad of the semiconductor element and an inner lead of the lead frame made of copper are connected by a bonding wire.

According to another embodiment of the present invention, in the semiconductor device, two or more of the semiconductor elements may be mounted by being stacked on the die pad of the lead frame made of copper.

According to the present invention, an epoxy resin composition for semiconductor encapsulant with satisfactory adhesion to a lead frame made of copper in which oxidation has progressed, an excellent mold releasing property when molded, and continuous moldability may be obtained. In addition, a semiconductor device with excellent reliability may be obtained if encapsulating a semiconductor element such as IC and LSI using this epoxy resin composition for semiconductor encapsulant.

DESCRIPTION OF EMBODIMENTS

Figure 1:
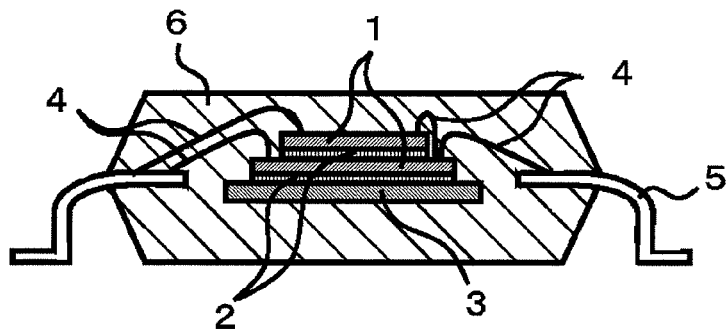
FIG. 1 is a diagram showing a cross-sectional structure for one example of a semiconductor device using an epoxy resin composition for semiconductor encapsulant according to the present invention.

An epoxy resin composition for semiconductor encapsulant of the present invention includes (A) an epoxy resin, (B) a curing agent, (C) an inorganic filler, and (D) a compound in which a copolymer of 1-alkene having 5 to 80 carbon atoms and maleic anhydride is esterified with an alcohol having 5 to 25 carbon atoms in the presence of a compound represented by General Formula (1). As a result, an epoxy resin composition for semiconductor encapsulant with satisfactory adhesion to a lead frame made of copper in which oxidation has progressed, an excellent mold releasing property when molded, and continuous moldability may be obtained. A semiconductor device of the present invention includes an element encapsulated with a cured substance of the epoxy resin composition for semiconductor encapsulant described above. As a result, a semiconductor device with excellent reliability may be obtained. Hereinafter, the present invention will be described in detail.

First, the epoxy resin composition for semiconductor encapsulant of the present invention will be described. The epoxy resin of (A) component used in the epoxy resin composition for semiconductor encapsulant of the present invention is a resin generally used as an epoxy resin composition for semiconductor encapsulant and is not particularly limited, however, for example, an epoxidized novolac resin, including a phenol novolac-type epoxy resin or an ortho-cresol novolac-type epoxy resin, obtained by condensing or co-condensing phenols such as phenol, cresol, xylenol, resorcin, catechol, bisphenol A or bisphenol F, and/or naphthols such as α-naphthol, β-naphthol or dihydroxynaphthalene with a compound having an aldehyde group such as formaldehyde, acetaldehyde, propionaldehyde, benzaldehyde and salicylaldehyde, under an acidic catalyst, a biphenyl-type epoxy resin which is diglycidyl ether of bisphenol A, bisphenol F, bisphenol S or bisphenol A/D, or diglycidyl ether of alkyl substituted or unsubstituted biphenol, an epoxy compound of phenol aralkyl resin synthesized from phenols and/or naphthols and dimethoxy paraxylene or bis(methoxymethyl)biphenyl, a stilbene-type epoxy resin, a hydroquinone-type epoxy resin, a glycidyl ester-type epoxy resin obtained by the reaction of a polybasic acid such as phthalic acid or dimer acid and epichlorohydrin, a glycidyl amine-type epoxy resin obtained by the reaction of a polyamine such as diaminodiphenylmethane or isocyanuric acid and epichlorohydrin, a dicyclopentadiene-type epoxy resin which is an epoxy compound of a co-condensed resin of dicyclopentadiene and phenols, an epoxy resin having a naphthalene ring, a triphenol methane-type epoxy resin, a trimethylolpropane-type epoxy resin, a terpene-modified epoxy resin, a linear aliphatic epoxy resin obtained by oxidizing 1-alkene bond using a peracid such as peracetic acid, an alicyclic epoxy resin, and an epoxy resin in which these epoxy resins are modified with silicone, acrylonitrile, butadiene, isoprene-based rubber, a polyamide-based resin, or the like may be included, and these resins may be used either alone or as a combination of two or more.

Among these, a biphenyl-type epoxy resin represented by General Formula (5), a phenol aralkyl-type epoxy resin having a phenylene skeleton represented by General Formula (6), or a phenol aralkyl-type epoxy resin having a biphenylene skeleton represented by General Formula (7) is preferable from the viewpoint of adhesion to the lead frame made of copper in which oxidation has progressed.

$R^4$ to $R^7$ in General Formula (5) are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms. The alkyl group having 1

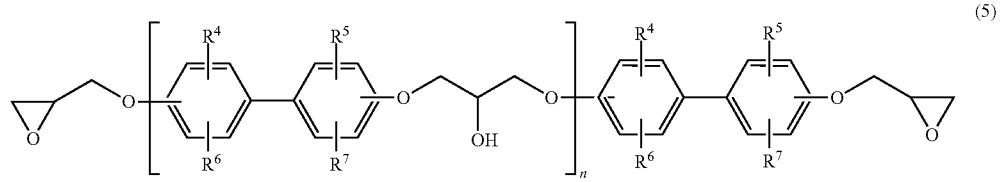

(5)

(In General Formula (5), $R^4$ to $R^7$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, all of them may be the same as or different from each other, and n represents an integer of 0 to 3.)

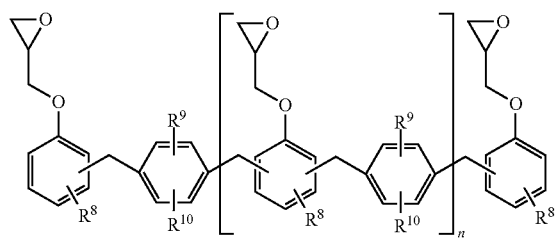

(6)

(In General Formula (6), $R^8$ to $R^{10}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^8$ to $R^{10}$ may be the same as or different from each other, and n represents an integer of 0 to 20.)

to 10 carbon atoms may include a methyl group, an ethyl group, a propyl group, a butyl group, an isopropyl group, an isobutyl group, or the like. The alkoxy group having 1 to 10 carbon atoms may include a methoxy group, an ethoxy group, a propoxy group, a butoxy group, or the like. The aryl group having 6 to 10 carbon atoms may include a phenyl group, a tolyl group, a xylyl group, or the like. The aralkyl group having 6 to 10 carbon atoms may include a benzyl group, a phenethyl group, or the like. In the above substituents, a hydrogen atom may be substituted with halogen, a hydroxyl group, an amino group, a cyano group, or the like. Among the above substituents, a hydrogen atom or a methyl group is preferable.

As the biphenyl-type epoxy resin represented by General Formula (5), an epoxy resin of which a main component is 4,4'-bis(2,3-epoxypropoxy)biphenyl or 4,4'-bis(2,3-epoxypropoxy)-3,3',5,5'-tetramethylbiphenyl, an epoxy resin obtained by the reaction of epichlorohydrin and 4,4'-biphenol or 4,4-(3,3',5,5'-tetramethyl)biphenol, or the like, may be included, and among these, an epoxy resin of which a main component is 4,4'-bis(2,3-epoxypropoxy)-3,3',5,5'-tetramethylbiphenyl is more preferable, and, for example, YX-4000K, YX-4000H (manufactured by Japan Epoxy Resins Co., Ltd., trade name), or the like, is commercially available. If this biphenyl-type epoxy resin is used, adhesion to the lead frame made of copper in which oxidation has progressed may be improved. The mixing amount is preferably 20% by

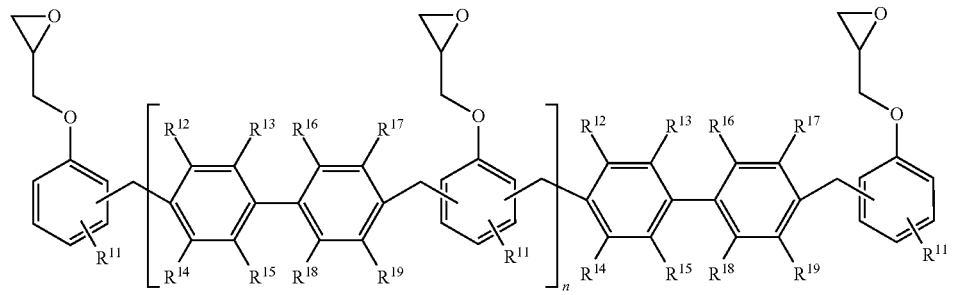

(7)

(In General Formula (7), $R^{11}$ to $R^{19}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^{11}$ to $R^{19}$ may be the same as or different from each other, and n represents an integer of 0 to 3.)

mass or more, more preferably 30% by mass or more, and even more preferably 50% by mass or more with regard to the total amount of epoxy resin in order to demonstrate its performance.

$R^8$ to $R^{10}$ in General Formula (6) are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms. The alkyl group having 1 to 10 carbon atoms may include a methyl group, an ethyl group, a propyl group, a butyl group, an isopropyl group, an isobutyl group, or the like. The alkoxy group having 1 to 10 carbon atoms may include a methoxy group, an ethoxy group, a propoxy group, a butoxy group, or the like. The aryl group having 6 to 10 carbon atoms may include a phenyl group, a tolyl group, a xylyl group, or the like. The aralkyl group having 6 to 10 carbon atoms may include a benzyl group, a phenethyl group, or the like. In the above substituents, a hydrogen atom may be substituted with halogen, a hydroxyl group, an amino group, a cyano group, or the like. Among the above substituents, a hydrogen atom or a methyl group is preferable.

The phenol aralkyl-type epoxy resin having a phenylene skeleton represented by General Formula (6) is preferably an epoxy resin of which a main component is n=0, and, for example, NC2000 (manufactured by Nippon Kayaku Co., Ltd., trade name) is commercially available. If this phenol aralkyl-type epoxy resin having a phenylene skeleton is used, the distance between crosslinking points becomes larger, therefore, an elastic modulus of the cured substance may be reduced. The mixing amount is preferably 10% by mass or more and more preferably 20% by mass or more with regard to the total amount of epoxy resin in order to demonstrate its performance.

$R^{11}$ to $R^{19}$ in General Formula (7) are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms. The alkyl group having 1 to 10 carbon atoms may include a methyl group, an ethyl group, a propyl group, a butyl group, an isopropyl group, an isobutyl group, or the like. The alkoxy group having 1 to 10 carbon atoms may include a methoxy group, an ethoxy group, a propoxy group, a butoxy group, or the like. The aryl group having 6 to 10 carbon atoms may include a phenyl group, a tolyl group, a xylyl group, or the like. The aralkyl group having 6 to 10 carbon atoms may include a benzyl group, a phenethyl group, or the like. In the above substituents, a hydrogen atom may be substituted with halogen, a hydroxyl group, an amino group, a cyano group, or the like. Among the above substituents, a hydrogen atom or a methyl group is preferable.

The phenol aralkyl-type epoxy resin having a biphenylene skeleton represented by General Formula (7) is more preferably an epoxy resin of which a main component is n=0, and, for example, NC-3000L (manufactured by Nippon Kayaku Co., Ltd., trade name) is commercially available. If this phenol aralkyl-type epoxy resin having a biphenylene skeleton is used, the distance between crosslinking points becomes larger, therefore, an elastic modulus of the cured substance may be reduced. The mixing amount is preferably 10% by mass or more and more preferably 20% by mass or more with regard to the total amount of epoxy resin in order to demonstrate its performance.

The biphenyl-type epoxy resin represented by General Formula (5), the phenol aralkyl-type epoxy resin having a phenylene skeleton represented by General Formula (6), and the phenol aralkyl-type epoxy resin having a biphenylene skeleton represented by General Formula (7), respectively, may be used either alone or as a combination of two or more. If used as a combination of two or more, the mixing amount is preferably 50% by mass or more and more preferably 70% by mass or more in total with regard to the total amount of the epoxy resin.

The mixing ratio of the whole epoxy resin of (A) component used in the epoxy resin composition for semiconductor encapsulant of the present invention is not particularly limited, however, is preferably greater than or equal to 1% by mass and less than or equal to 15% by mass, and more preferably greater than or equal to 2% by mass and less than or equal to 10% by mass in the whole epoxy resin composition. If the mixing ratio of the whole epoxy resin of (A) component is greater than or equal to the above lower limit, concerns for reduction of liquidity and the like are less likely to occur. If the mixing ratio of the whole epoxy resin of (A) component is less than or equal to the above upper limit, concerns for reduction of soldering resistance and the like are less likely to occur.

The curing agent of (B) component used in the epoxy resin composition for semiconductor encapsulant of the present invention is generally used in an epoxy resin composition for semiconductor encapsulant, therefore, is not particularly limited, however, may include, for example, a resin, including a phenol novolac resin or a cresol novolac resin, obtained by condensing or co-condensing phenols such as phenol, cresol, resorcin, catechol, bisphenol A, bisphenol F, phenylphenol or aminophenol, and/or naphthols such as α-naphthol, β-naphthol or dihydroxynaphthalene with a compound having an aldehyde group such as formaldehyde, under an acidic catalyst, a phenol aralkyl resin synthesized from phenols and/or naphthols and dimethoxy paraxylene or bis(methoxymethyl) biphenyl or the like, and these may be used either alone or as a combination of two or more.

Among these, a phenol aralkyl resin having a biphenylene skeleton represented by General Formula (8) is preferable from the viewpoint of liquidity and a low hygroscopic property.

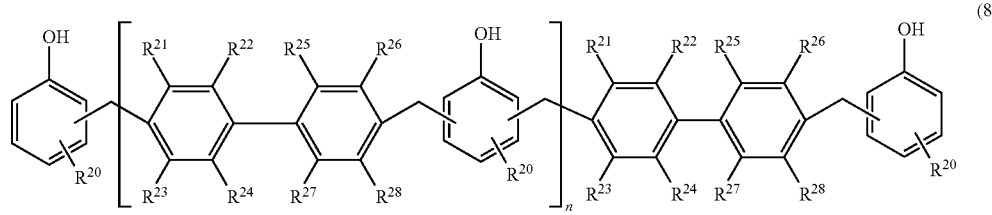

(8)

(In General Formula (8), $R^{20}$ to $R^{28}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^{20}$ to $R^{28}$ may be the same as or different from each other, and n represents an integer of 0 to 10.)

All of $R^{20}$ to $R^{28}$ in General Formula (8) may be the same as or different from each other, and are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms. The alkyl group having 1 to 10 carbon atoms may include a methyl group, an ethyl group, a propyl group, a butyl group, an isopropyl group, an isobutyl group, or the like. The alkoxy group having 1 to 10 carbon atoms may include a methoxy group, an ethoxy group, a propoxy group, a butoxy group, or the like. The aryl group having 6 to 10 carbon atoms may include a phenyl group, a tolyl group, a xylyl group, or the like. The aralkyl group having 6 to 10 carbon atoms may include a benzyl group, a phenethyl group, or the like. In the above substituents, a hydrogen atom may be substituted with halogen, a hydroxyl group, an amino group, a cyano group, or the like. Among the above substituents, a hydrogen atom or a methyl group is preferable.

The phenol aralkyl resin having a biphenylene skeleton represented by General Formula (8) may include, for example, a compound in which $R^{20}$ to $R^{28}$ are all hydrogen atoms or the like, and is preferably a mixture of a condensate including 50% by mass or more of a component in which n is 0 from the viewpoint of melt viscosity. As such a compound, MEH-7851SS (manufactured by Meiwa Kasei Co., Ltd., trade name) is commercially available. If the phenol aralkyl resin having a biphenylene skeleton is used, the mixing amount is preferably 50% by mass or more and more preferably 70% by mass or more with regard to the total amount of the curing agent in order to demonstrate its performance.

The mixing ratio of the curing agent of (B) component used in the epoxy resin composition for semiconductor encapsulant of the present invention is not particularly limited, however, is preferably greater than or equal to 0.5% by mass and less than or equal to 12% by mass, and more preferably greater than or equal to 1% by mass and less than or equal to 9% by mass in the whole epoxy resin composition. If the mixing ratio of the curing agent of (B) component is greater than or equal to the above lower limit, concerns for reduction of liquidity and the like are less likely to occur. If the mixing ratio of the curing agent of (B) component is less than or equal to the above upper limit, concerns for reduction of soldering resistance and the like are less likely to occur.

The equivalent ratio of the epoxy resin of (A) component and the curing agent of (B) component, that is, the ratio of the number of epoxy groups in the epoxy resin/the number of hydroxyl groups in the curing agent, is not particularly limited, however, is preferably set in the range of 0.5 to 2, and more preferably set in the range of 0.6 to 1.5 in order to suppress each unreacted component to be small. Furthermore, it is even more preferable that the ratio be in the range of 0.8 to 1.2 in order to obtain an epoxy resin composition for semiconductor encapsulant with excellent moldability and reflow resistance.

The inorganic filler of (C) component used in the epoxy resin composition for semiconductor encapsulant of the present invention is mixed into the epoxy resin composition for semiconductor encapsulant in order to reduce hygroscopicity, to reduce a linear expansion coefficient, to improve thermal conductivity and to improve strength, and may include, for example, particulate materials such as fused silica, crystalline silica, alumina, calcium silicate, calcium carbonate, potassium titanate, silicon carbide, silicon nitride, aluminum nitride, boron nitride, beryllia, zirconia, zircon, forsterite, steatite, spinel, mullite or titania, beads spheronizing these, a glass fiber, or the like. In addition, the inorganic filler having a flame-retardant effect may include aluminum hydroxide, magnesium hydroxide, zinc borate, zinc molybdate, or the like. These inorganic fillers may be used either alone or as a combination of two or more. Among the above inorganic fillers, fused silica is preferable from the viewpoint of reducing a linear expansion coefficient, alumina is preferable from the viewpoint of high thermal conductivity, and the shape of the filler is preferably a spherical shape from the viewpoint of liquidity and mold abrasivity when molded.

A mixing amount of (C) the inorganic filler is preferably greater than or equal to 80% by mass and less than or equal to 96% by mass, more preferably greater than or equal to 82% by mass and less than or equal to 92% by mass, and even more preferably greater than or equal to 86% by mass and less than or equal to 90% by mass with regard to the epoxy resin composition for semiconductor encapsulant from the viewpoint of moldability, a hygroscopic property, reducing a linear expansion coefficient, and improving strength. Reliability tends to decrease when the mixing amount is less than the lower limit, and moldability tends to decrease when the mixing amount exceeds the upper limit.

The epoxy resin composition for semiconductor encapsulant of the present invention includes (D) a compound in which a copolymer of 1-alkene having 5 to 80 carbon atoms and maleic anhydride is esterified with an alcohol having 5 to 25 carbon atoms in the presence of a compound represented by General Formula (1) as a mold releasing agent. In particular, the (D) component is more preferably included in an amount of 55 to 100% by mass in all mold releasing agents. The compound of (D) component has high dispersibility in the epoxy resin of (A) component, and has an excellent balance of adhesion to copper in which oxidation has progressed and a mold releasing property.

(1)

(In General Formula (1), $R^1$ is selected from the group consisting of an alkyl group having 1 to 5 carbon atoms, a halogenated alkyl group having 1 to 5 carbon atoms, and an aromatic group having 6 to 10 carbon atoms.)

In the present invention, in order to improve the balance of adhesion to copper in which oxidation has progressed and a mold releasing property, the use of a compound represented by General Formula (1) as a catalyst when a copolymer of 1-alkene and maleic anhydride is esterified with an alcohol is important. By using the compound represented by General Formula (1) as a catalyst, the esterification proceeds efficiently when a copolymer of 1-alkene and maleic anhydride is esterified with an alcohol compared to a case in which catalysts are not used which is the method in the related art, or other catalysts are used, therefore, less residual unreacted alcohol is present, and when the (D) component produced is mixed into the epoxy resin composition, a balance between adhesion to copper in which oxidation has progressed and a mold releasing property is made to be excellent and continuous moldability may be improved.

$R^1$ in the General Formula (1) is selected from the group consisting of an alkyl group having 1 to 5 carbon atoms, a halogenated alkyl group having 1 to 5 carbon atoms, and an aromatic group having 6 to 10 carbon atoms. The alkyl group having 1 to 5 carbon atoms may include a methyl group, an ethyl group, a propyl group, a butyl group, an isopropyl group, an isobutyl group, or the like. The halogenated alkyl group having 1 to 5 carbon atoms may include a trifluoromethyl group, a trichloromethyl group, a 2-bromoethyl group, or the like. The aromatic group having 6 to 10 carbon atoms may include a phenyl group, a tolyl group, a xylyl group, a naphthyl group, or the like. The hydrogen atoms of the aromatic group such as this may be substituted with halogen, a hydroxyl group, an amino group, a cyano group, or the like. The aromatic group having such a substituent may include a trifluoromethylphenyl group in which hydrogen atoms of the methyl group of the tolyl group are substituted with fluorine, a pentafluorophenyl group in which hydrogen of the phenyl group are substituted with fluorine, a hydroxyphenyl group, a cyanophenyl group, an aminophenyl group, or the like.

Examples of the compound represented by General Formula (1) may include p-toluenesulfonic acid, benzenesulfonic acid, m-xylene-4-sulfonic acid, p-xylene-2-sulfonic acid, mesitylenesulfonic acid, 2-naphthalenesulfonic acid, 4-(2-bromoethyl)benzenesulfonic acid, methanesulfonic acid, ethanesulfonic acid, trifluoromethanesulfonic acid, or the like. Among these, trifluoromethanesulfonic acid and the compound represented by General Formula (3) are more preferable.

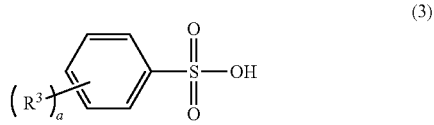

(3)

(In General Formula (3), $R^3$'s are selected from an alkyl group having 1 to 5 carbon atoms and a halogenated alkyl group having 1 to 5 carbon atoms, and may be the same as or different from each other, and a is an integer of 0 to 5.)

a in the General Formula (3) is an integer of 0 to 5, and $R^3$'s are selected from an alkyl group having 1 to 5 carbon atoms and a halogenated alkyl group having 1 to 5 carbon atoms. The alkyl group having 1 to 5 carbon atoms may include a methyl group, an ethyl group, a propyl group, a butyl group, an isopropyl group, an isobutyl group or the like, and the halogenated alkyl group having 1 to 5 carbon atoms may include a trifluoromethyl group, a trichloromethyl group, a 2-bromoethyl group, or the like.

The compound represented by General Formula (3) may include p-toluenesulfonic acid, benzenesulfonic acid, m-xylene-4-sulfonic acid, p-xylene-2-sulfonic acid, mesitylenesulfonic acid, 2-naphthalenesulfonic acid, 4-(2-bromoethyl) benzenesulfonic acid, or the like. Among these, p-toluenesulfonic acid is particularly preferable, and for example, p-toluenesulfonic acid (manufactured by Tokyo Kasei Co., Ltd., trade name) is commercially available. If this p-toluenesulfonic acid is used as an esterification catalyst, the esterification proceeds particularly efficiently, therefore, less residual unreacted alcohol is present, and when the (D) component produced is mixed into the epoxy resin composition, a balance between adhesion to copper in which oxidation has progressed and a mold releasing property is made to be excellent and continuous moldability may be further improved.

The mixing amount of the compound represented by General Formula (1) is preferably 0.01 to 5% by mass and more preferably 0.02 to 2% by mass with regard to the total amount of the copolymer of 1-alkene and maleic anhydride and the alcohol in order to demonstrate its performance. If the amount is below the lower limit, the compound does not function sufficiently as an esterification catalyst and if the amount exceeds the upper limit, the catalyst residue tends to adversely affect moisture resistance reliability of a Cu wire.

A 1-alkene monomer used in the synthesis of the compound in which a copolymer of 1-alkene and maleic anhydride is esterified with an alcohol is not particularly limited as long as it has 5 to 80 carbon atoms, however, may include, for example, a straight-chain 1-alkene such as 1-pentene, 1-hexene, 1-octene, 1-decene, 1-dodecene, 1-octadecene, 1-eicosene, 1-docosene, 1-tetracontane, 1-hexacontane, 1-octacosene, 1-triacontane, 1-hentriacontane, 1-dotriacontane, 1-tritriacontane, 1-tetratriacontane, 1-pentatriacontane, 1-hexatriacontane, 1-tetracontane, 1-hentetracontane, 1-dotetracontane, 1-tritetracontane, 1-tetratetracontane, 1-pentacontane, 1-henpentacontane, 1-dopentacontane, 1-tripentacontane, 1-pentapentacontane, 1-hexacontane, 1-heptacontane or 1-octacontane, or a branched 1-alkene such as 3-methyl-1-triacontane, 3,4-dimethyl-triacontane, 3-methyl-1-tetracontane or 3,4-dimethyl-tetracontane, or the like, and these may be used either alone or as a combination of two or more. The number of carbon atoms of the 1-alkene monomer used in the synthesis of the compound in which a copolymer of 1-alkene and maleic anhydride is esterified with an alcohol is more preferably 10 to 70 from the viewpoint of adhesion to the lead frame made of copper in which oxidation has progressed, even more preferably 28 to 60 from the viewpoint of continuous moldability (a mold releasing property), and a mixture including 1-octacosene, 1-triacontane, 1-tetracontane, 1-pentacontane and 1-hexacontane is more preferable.

The copolymer of 1-alkene and maleic anhydride used in the synthesis of (D) component of the present invention is not particularly limited, however, may include, for example, a compound represented by General Formula (9), a compound represented by General Formula (10) or the like, and as commercially available products, DIACARNA (registered trademark) 30 (manufactured by Mitsubishi Chemical Corporation, trade name) using 1-octacosene, 1-triacontane, 1-tetracontane, 1-pentacontane and 1-hexacontane as raw materials is available.

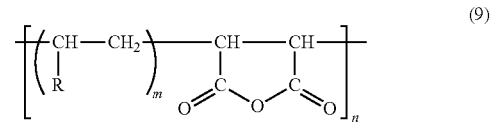

(9)

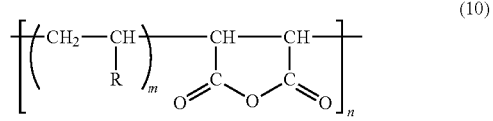

(10)

R in General Formulae (9) and (10) represents an aliphatic hydrocarbon group having 3 or more carbon atoms, and n is an integer of 1 or more. m represents a copolymerization ratio of 1-alkene and maleic anhydride. While not particularly limited, when 1-alkene is made to be X moles and maleic anhydride is made to be Y moles, X/Y, that is, m is preferably 1/4 to 5/1, m is more preferably 1/2 to 2/1, and even more preferably around 1/1 which is approximately equimolar.

A method for producing the copolymer of 1-alkene and maleic anhydride is not particularly limited, and general copolymerization methods such as reacting raw materials may be used. An organic solvent capable of dissolving 1-alkene and maleic anhydride may also be used in the reaction. The organic solvent is not particularly limited, however, is preferably toluene, and aromatic-based solvents, ether-based solvents, halogen-based solvents or the like may also be used. The reaction temperature varies depending on the type of the organic solvent used, however, is preferably 50 to 200° C. and even more preferably 100 to 150° C. from the viewpoint of reactivity and productivity. Reaction time is not particularly limited as long as the copolymer is obtained, however, is preferably 1 to 30 hours, more preferably 2 to 15 hours, and even more preferably 4 to 10 hours from the viewpoint of productivity. After completion of the reaction, unreacted components, solvents and the like may be removed, if necessary, under heating and reduced pressure and the like. As the conditions, the temperature is preferably 100 to 220° C. and more preferably 120 to 180° C., the pressure is preferably $13.3 \times 10^3$ Pa or less and more preferably $8 \times 10^3$ Pa or less, and the time is preferably 0.5 to 10 hours. In addition, a radical polymerization initiator such as azobisisobutyronitrile (AIBN) or benzoyl peroxide (BPO) may be added to the reaction when necessary.

The alcohol used in the synthesis of the compound in which a copolymer of 1-alkene and maleic anhydride is esterified with an alcohol is not particularly limited as long as it has 5 to 25 carbon atoms, however, may include, for example, a straight chain or branched aliphatic saturated alcohol such as pentyl alcohol, hexyl alcohol, octyl alcohol, decyl alcohol, lauryl alcohol, myristyl alcohol, cetyl alcohol, stearyl alcohol, eicosyl alcohol, behenyl alcohol, 2-methyl-decan-1-ol, 2-ethyl-decan-1-ol, 2-hexyl-octan-1-ol, a straight chain or branched aliphatic unsaturated alcohol such as hexenol, 2-hexen-1-ol, 1-hexen-3-ol, pentenol, 2-methyl-1-pentenol or the like, and these may be used either alone or as a combination of two or more. Among these, a straight-chain alcohol having 10 to 25 carbon atoms is preferable from the viewpoint of a mold releasing load, and a straight-chain aliphatic saturated alcohol having 15 to 20 carbon atoms is more preferable from the viewpoint of continuous moldability. If the number of carbon atoms of the alcohol used in the synthesis of the compound in which a copolymer of 1-alkene and maleic anhydride is esterified with an alcohol is less than the above lower limit, continuous moldability (a mold releasing) is poor, and if exceeds the above upper limit, adhesion to a lead frame made of copper in which oxidation has progressed tends to be reduced.

The molar ratio of the reaction between the alcohol and the copolymer of 1-alkene and maleic anhydride is not particularly limited and may be set arbitrarily, however, it is preferable that the molar ratio of the reaction be appropriately set depending on the target epoxy resin composition for semiconductor encapsulant since the degree of hydrophilicity may be controlled by adjusting this molar ratio of the reaction. An organic solvent capable of dissolving 1-alkene and maleic anhydride may also be used in the reaction. The organic solvent is not particularly limited, however, is preferably toluene, and aromatic-based solvents, ether-based solvents, halogen-based solvents or the like may also be used. The reaction temperature varies depending on the type of organic solvent used, however, is preferably 50 to 200° C. and even more preferably 100 to 150° C. from the viewpoint of reactivity and productivity. A reaction time is not particularly limited as long as the copolymer is obtained, however, is preferably 1 to 30 hours, more preferably 2 to 15 hours, and even more preferably 4 to 10 hours from the viewpoint of productivity. After completion of the reaction, unreacted components, solvents and the like may be removed, if necessary, under heating and reduced pressure and the like. As the condition, the temperature is preferably 100 to 220° C. and more preferably 120 to 180° C., the pressure is preferably $13.3 \times 10^3$ Pa or less and more preferably $8 \times 10^3$ Pa or less, and the time is preferably 0.5 to 10 hours.

Examples of (D) the compound in which a copolymer of 1-alkene and maleic anhydride is esterified with an alcohol using the compound represented by General Formula (1) may include a compound including one or more selected from diesters represented by (a) or (b) of General Formula (11) and monoesters represented by (c) to (f) of General Formula (11) in the structure as a repeating unit or the like, and may include non-esters represented by (g) or (h) of General Formula (11) in the structure. Such compounds may include (1) those composed of any one of (a) to (f) of General Formula (11) alone in the main chain skeleton, (2) those including two or more of (a) to (f) of General Formula (11) in the main chain skeleton randomly, regularly and in a block form, (3) those including one, or two or more of (a) to (f) of General Formula (11), and including (g) and/or (h) in the main chain skeleton randomly, regularly and in a block form, or the like, and these may be used either alone or as a combination of two or more. In addition, (4) those including (g) and (h) of General Formula (11) in the main chain skeleton randomly, regularly and in a block form, and/or, (5) those composed of each of (g) or (h) of General Formula (11) alone in the main chain skeleton, may also be included. An esterification ratio of the compound in which a copolymer of 1-alkene and maleic anhydride is esterified with an alcohol is preferably 35 mol % or more from the viewpoint of adhesion and a mold releasing property, and the compound in which a copolymer of 1-alkene and maleic anhydride is esterified with an alcohol is preferably a compound including 70 mol % or more of one, or two or more of the monoesters represented by (c) to (f) of General Formula (11), and more preferably a compound including 80 mol % or more.

(11)

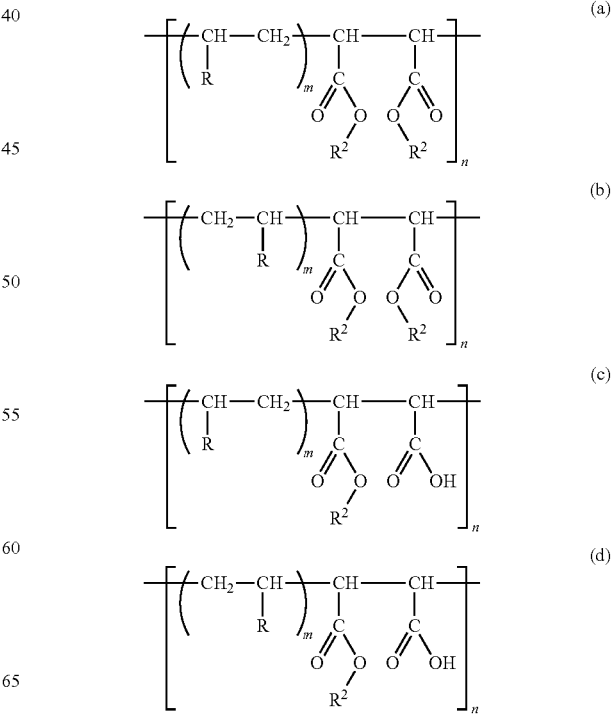

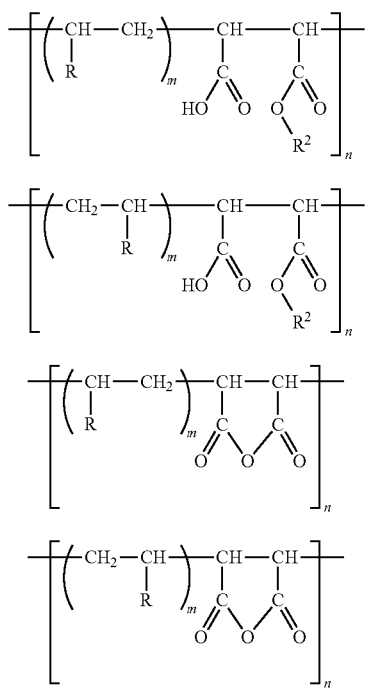

R in General Formulae (a) to (h) represents an aliphatic hydrocarbon group having 3 to 78 carbon atoms, $R^2$ represents a hydrocarbon group having 5 to 25 carbon atoms. n is an integer of 1 or more. m represents a copolymerization ratio of 1-alkene and maleic anhydride. While not particularly limited, but when 1-alkene is made to be X moles and maleic anhydride is made to be Y moles, X/Y, that is, m is preferably 1/4 to 5/1, m is more preferably 1/2 to 2/1, and even more preferably around 1/1 which is approximately equimolar.

A number-average molecular weight of (D) the compound in which a copolymer of 1-alkene and maleic anhydride is esterified with an alcohol using the compound represented by General Formula (1) is not particularly limited as long as the number of repeating units having the structure of (a) to (f) of General Formula (11) is 1 or more, and the balance between adhesion to a lead frame made of copper in which oxidation has progressed and a mold releasing property may be achieved in any molecular weight region, however, the number average molecular weight is preferably 2,000 to 10,000.

The mixing amount of (D) the compound in which a copolymer of 1-alkene and maleic anhydride is esterified with an alcohol using the compound represented by General Formula (1) is not particularly limited, however, is preferably greater than or equal to 0.5 parts by mass and less than or equal to 10 parts by mass, and more preferably greater than or equal to 1 parts by mass and less than or equal to 5 parts by mass with regard to 100 parts by mass of the epoxy resin of (A) component. If the mixing amount is less than the above lower limit, a mold releasing property tends to be reduced, and if exceeds the above upper limit, adhesion to a lead frame made of copper in which oxidation has progressed becomes insufficient.

The epoxy resin composition for semiconductor encapsulant of the present invention is a byproduct compound of the esterification reaction between the alcohol and the copolymer of 1-alkene and maleic anhydride, and may include a compound represented by General Formula (2) which is an ester compound of the compound represented by General Formula (1) and the alcohol. When the epoxy resin composition for semiconductor encapsulant including the compound in which a copolymer of 1-alkene and maleic anhydride is esterified with an alcohol includes the compound represented by General Formula (2), it may mean that the compound represented by General Formula (1) is used as a catalyst when the copolymer of 1-alkene and maleic anhydride is esterified with an alcohol in the synthesis process of the compound in which a copolymer of 1-alkene and maleic anhydride is esterified with an alcohol.

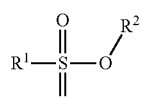

(2)

(In General Formula (2), $R^1$ is selected from the group consisting of an alkyl group having 1 to 5 carbon atoms, a halogenated alkyl group having 1 to 5 carbon atoms and an aromatic group having 6 to 10 carbon atoms, and $R^2$ represents an alkyl group having 5 to 25 carbon atoms.)

$R^1$ in General Formula (2) is selected from the group consisting of an alkyl group having 1 to 5 carbon atoms, a halogenated alkyl group having 1 to 5 carbon atoms and an aromatic group having 6 to 10 carbon atoms. $R^1$ is synonymous with $R^1$ in General Formula (1). In addition, $R^2$ represents an alkyl group having 5 to 25 carbon atoms, and this substituent may include a decyl group, a dodecyl group, a pentadecyl group, a hexadecyl group, an octadecyl group, an eicosyl group, a behenyl group, a pentacosyl group, a 2-methyl-octyl group, or the like.

The compound represented by General Formula (2) may include octadecyl p-toluenesulfonate, decyl p-toluenesulfonate, behenyl p-toluenesulfonate, octadecyl benzenesulfonate, octadecyl m-xylene-4-sulfonate, octadecyl p-xylene-2-sulfonate, octadecyl mesitylenesulfonate, octadecyl 2-naphthalenesulfonate, octadecyl 4-(2-bromoethyl)benzenesulfonate, octadecyl methanesulfonate, octadecyl ethanesulfonate, octadecyl trifluoromethanesulfonate, or the like.

When a compound represented by General Formula (3) is used as the compound represented by General Formula (1), a compound represented by General Formula (4) which is an ester compound of the compound represented by General Formula (3) and the alcohol may be included.

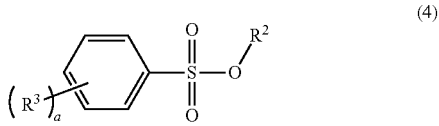

(4)

(In General Formula (4), $R^2$ represents an alkyl group having 5 to 25 carbon atoms, $R^3$'s are selected from an alkyl group having 1 to 5 carbon atoms and a halogenated alkyl group having 1 to 5 carbon atoms with all of them being the same as or different from each other, and a is an integer of 0 to 5.)

a in General Formula (4) is an integer of 0 to 5, $R^2$ represents an alkyl group having 5 to 25 carbon atoms, $R^3$'s are selected from an alkyl group having 1 to 5 carbon atoms and a halogenated alkyl group having 1 to 5 carbon atoms. $R^3$ in General Formula (4) is synonymous with $R^3$ in General Formula (3), and $R^2$ is synonymous with $R^2$ in General Formula (2).

The compound represented by General Formula (4) may include octadecyl p-toluenesulfonate, decyl p-toluenesulfonate, behenyl p-toluenesulfonate, octadecyl benzenesulfonate, octadecyl m-xylene-4-sulfonate, octadecyl p-xylene-2-sulfonate, octadecyl mesitylenesulfonate, octadecyl 2-naphthalenesulfonate, octadecyl 4-(2-bromoethyl)benzenesulfonate, or the like.

An upper limit of the mixing amount of the compound represented by General Formula (2) is not particularly limited, however, is preferably 100 ppm or less, and more preferably 40 ppm or less with regard to all resin compositions. If the amount exceeds the above upper limit, moisture resistance reliability of Cu wire tends to deteriorate. In addition, a lower limit of the mixing amount of the compound represented by General Formula (2) is not particularly limited and a degree to confirm its existence qualitatively is acceptable, however, it is preferably 0.4 ppm or more with regard to all resin compositions. If the amount is below the lower limit, adhesion and soldering resistance tends to become insufficient.

The epoxy resin composition for semiconductor encapsulant of the present invention may include 1-alkene having 5 to 58 carbon atoms. This 1-alkene having 5 to 58 carbon atoms may be residual 1-alkene unreacted in the process of a copolymerization of 1-alkene and maleic anhydride. The amount of 1-alkene having 5 to 58 carbon atoms included in the epoxy resin composition for semiconductor encapsulant of the present invention is preferably greater than or equal to 8 parts by mass and less than or equal to 20 parts by mass with regard to 100 parts by mass of the (D) component. If the amount is within the above range, satisfactory continuous moldability may be obtained. If the amount is less than the above lower limit, a mold releasing property is sometimes reduced, and if the amount exceeds the upper limit, a mold stain or reduction of adhesion may sometimes occur.

In the epoxy resin composition for semiconductor encapsulant of the present invention, a curing accelerator may be used in order to obtain the epoxy resin composition with satisfactory curability and liquidity. The curing accelerator which may be used in the present invention is not particularly limited as long as it is commonly used in epoxy resin compositions for semiconductor encapsulant, however, may include, for example, a phosphorus atom-containing curing accelerator such as organic phosphine, a tetra-substituted phosphonium compound, a phosphobetaine compound, an adduct of a phosphine compounds and a quinone compound, or an adduct of a phosphonium compounds and a silane compound; or a nitrogen atom-containing curing accelerator such as 1,8-diazabicyclo(5,4,0)undecene-7, benzyldimethyl amine or 2-methyl imidazole, and these may be used either alone or as a combination of two or more. Among these, an organic phosphorus compound is preferable from the viewpoint of moldability.

Examples of the organic phosphine which may be used in the resin composition for semiconductor encapsulant of the present invention may include primary phosphines such as ethyl phosphine or phenyl phosphine, secondary phosphines such as dimethyl phosphine or diphenyl phosphine, or tertiary phosphines such as trimethylphosphine, triethylphosphine, tributylphosphine or triphenylphosphine.

Examples of the tetra-substituted phosphonium compound which may be used in the resin composition for semiconductor encapsulant of the present invention may include a compound represented by General Formula (12), or the like.

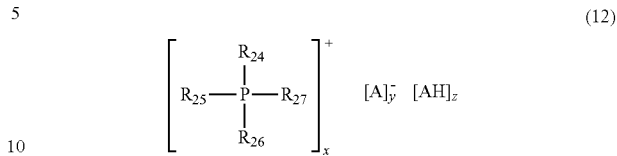

(In General Formula (12), P represents a phosphorus atom. $R^{24}$, $R^{25}$ $R^{26}$ and $R^{27}$ represent an aromatic group or an alkyl group. A represents an anion of an aromatic organic acid having at least one functional group selected from any of a hydroxyl group, a carboxyl group, and a thiol group in an aromatic ring. AH represents an aromatic organic acid having at least one functional group selected from any of a hydroxyl group, a carboxyl group, and a thiol group in an aromatic ring. x and y are integers of 1 to 3, z is an integer of 0 to 3, and x=y.)

The compound represented by General Formula (12), for example, is obtained as follows, however, the method is not limited to this. First, a tetra-substituted phosphonium halide, an aromatic organic acid and a base are blended in an organic solvent and are mixed uniformly, and an aromatic organic acid anion is generated in the solution system. When water is added subsequently, the compound represented by General Formula (12) may be precipitated. In the compound represented by General Formula (12), $R^{24}$, $R^{25}$, $R^{26}$ and $R^{27}$ which are bonded to the phosphorus atom are preferably phenyl groups, AH is preferably a compound having a hydroxyl group in an aromatic ring, that is, phenols, and A is preferably an anion of the phenols.

Examples of the phosphobetaine compound which may be used in the resin composition for semiconductor encapsulant of the present invention may include a compound represented by General Formula (13), or the like.

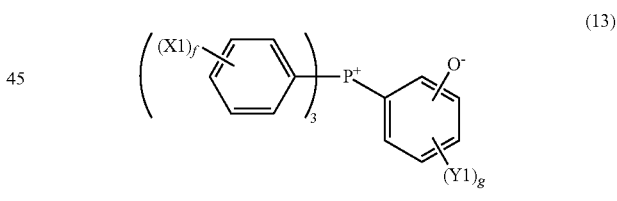

(In General Formula (13), 2 represents a phosphorus atom, X1 represents an alkyl group having 1 to 3 carbon atoms and Y1 represents a hydroxyl group. f is an integer of 0 to 5 and g is an integer of 0 to 4.)

The compound represented by General Formula (13), for example, is obtained as follows. First, triaromatic-substituted phosphine which is a tertiary phosphine is brought into contact with a diazonium salt, and after a step of substituting the triaromatic-substituted phosphine with the diazonium group included in the diazonium salt, the compound is obtained. However, an obtaining method is not limited to this.

Example of the adduct of a phosphine compound and a quinone compound which may be used in the resin composition for semiconductor encapsulant of the present invention may include a compound represented by General Formula (14), or the like.

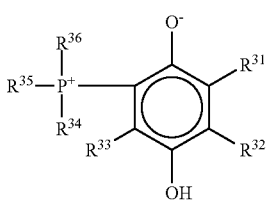

(14)

(In General Formula (14), P represents a phosphorus atom. $R^{34}$, $R^{35}$, and $R^{36}$ represent an alkyl group having 1 to 12 carbon atoms or an aryl group having 6 to 12 carbon atoms, and may be the same as or different from each other. $R^{31}$, $R^{32}$, and $R^{33}$ represent a hydrogen atom or a hydrocarbon group having 1 to 12 carbon atoms, may be the same as or different from each other, and $R^{31}$ and $R^{32}$ may be bonded to each other and become a cyclic structure.)

Examples of the phosphine compound used in the adduct of a phosphine compound and a quinone compound may preferably include those in which an aromatic ring is unsubstituted or substituted with an alkyl group or an alkoxy group such as triphenyl phosphine, tris(alkylphenyl)phosphine, tris(alkoxyphenyl)phosphine, trinaphthyl phosphine, tris(benzyl)phosphine, and the substituent such as an alkyl group or an alkoxyl group may include those having 1 to 6 carbon atoms. Triphenyl phosphine is preferable from the viewpoint of availability.

The quinone compound used in the adduct of a phosphine compound and a quinone compound may include o-benzoquinone, p-benzoquinone, anthraquinones or the like, and p-benzoquinone is preferable among these from the viewpoint of storage stability.

As the preparation method of the adduct of a phosphine compound and a quinone compound, the adduct may be obtained by contacting and mixing organic tertiary phosphine and benzoquinones in a solvent capable of dissolving both. As the solvent, those of which solubility for the adduct is low such as acetone or ketones such as methylethyl ketone is preferable, however, the solvent is not limited to these.

In the compound represented by General Formula (14), a compound in which $R^{34}$, $R^{35}$ and $R^{36}$ which are bonded to the phosphorus atom are phenyl groups and $R^{31}$, $R^{32}$ and $R^{33}$ are hydrogen atoms, that is, a compound in which 1,4-benzoquinone and triphenyl phosphine are added is preferable from the viewpoint of maintaining a low modulus of elasticity when heating the cured substance of the resin composition for semiconductor encapsulant.

The mixing amount of the curing accelerator is not particularly limited as long as it is an amount to achieve the curing accelerating effect, however, is preferably 0.1 to 10% by mass, and more preferably 1 to 5% by mass with regard to (A) the epoxy resin. If the amount is less than the lower limit, curability in a short time tends to be poor and if the amount exceeds the upper limit, curing speed is too fast, therefore, it is difficult to obtain satisfactory molded products due to unfilling and the like.

To the epoxy resin composition for semiconductor encapsulant of the present invention, a siloxane added polymer may be added for the purpose of obtaining the epoxy resin composition with satisfactory soldering resistance stress and liquidity. The siloxane added polymer is not particularly limited and well-known materials in the related art may be used, however, may include, for example, modified silicone oil in which part of the methyl substituent of dimethyl siloxane is substituted with a substituent such as an alkyl group, an epoxy group, a carboxyl group, an amino group, and the like.

The siloxane added polymer may be mixed with one, or two or more kinds, and may be used in the ratio of greater than or equal to 0.1% by mass and less than or equal to 2% by mass with regard to all epoxy resin compositions. If the mixing amount exceeds the upper limit, there are concerns such that surface stain may easily occur and resin bleed becomes longer, and if the mixing amount is less than the lower limit, problems may arise such that sufficiently low modulus of elasticity and dispersibility of the mold releasing agent may not be obtained.

To the epoxy resin composition for semiconductor encapsulant of the present invention, an anion exchanger may also be added from the viewpoint of improving moisture resistance of a device such as an IC, and high temperature leaving characteristics. The anion exchanger is not particularly limited and well-known materials in the related art may be used, however, may include, for example, hydrotalcite, or a hydroxide-containing compound of an element selected from antimony, bismuth, zirconium, titanium, tin, magnesium, and aluminum, and these may be used either alone or as a combination of two or more. Among these, hydrotalcite and hydroxide-containing compound of bismuth represented by General Formula (15) are preferable.

$$Mg_{1-x}Al_x(OH)_2(CO_3)_{x/2} \cdot mH_2O \quad (15)$$

(In General Formula (15), 0<X≤0.5, and m is a positive integer.)

The mixing amount of the anion exchanger is not particularly limited as long as a sufficient amount to capture ionic impurities such as a halogen ion is used, however, it is preferably greater than or equal to 0.1 parts by mass and less than or equal to 30 parts by mass, more preferably greater than or equal to 1 parts by mass and less than or equal to 10 parts by mass, and even more preferably greater than or equal to 2 parts by mass and less than or equal to 5 parts by mass with regard to 100 parts by mass of the epoxy resin of (A) component. If the mixing amount is less than the lower limit, capturing the ionic impurities tends to be insufficient, and if the mixing amount exceeds the upper limit, there are no great differences in effects compared to those of the upper limit or less, therefore, it is economically disadvantageous.

To the epoxy resin composition for semiconductor encapsulant of the present invention, in order to enhance adhesion between the resin component and the inorganic filler, well-known coupling agents such as a variety of silane-based compounds such as epoxysilane, mercaptosilane, aminosilane, alkylsilane, ureidosilane or vinylsilane, titanium-based compounds, aluminum chelates, or aluminum/zirconium-based compounds, may be added, as necessary. Examples of these may include a silane-based coupling agent such as vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, γ-glycidoxypropyltriethoxysilane, vinyltriacetoxysilane, γ-mercaptopropyltrimethoxysilane, γ-mercaptopropylmethyldimethoxysilane, γ-mercaptopropyltriethoxysilane, γ-aminopropyltrimethoxysilane, γ-aminopropylmethyldimethoxysilane, γ-aminopropyltriethoxysilane, γ-anilinopropyltrimethoxysilane, γ-anilinopropylmethyldimethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, N-β-(N-vinylbenzylaminoethyl)-γ-aminopropyltrimethoxysilane, γ-chloropropyltrimethoxysilane, hexamethyldisilane or vinyltrimethoxysilane, a titanate-based coupling agent such as isopropyltriisostearoyltitanate, isopropyltris(dioctylpyrophosphate)titanate, isopropyltri(N-aminoethyl-aminoethyl) titanate, tetraoctylbis(ditridecylphosphite)titanate, tetra(2,2-diallyloxymethyl-1-butyl)bis(ditridecyl) phosphitetitanate, bis(dioctylpyrophosphate)oxyacetatetitanate, bis(dioctylpyrophosphate)ethylenetitanate, isopropyltrioctanoyltitanate, isopropyldimethacrylisostearoyltitanate, isopropyltridodecylbenzenesulfonyltitanate, isopropylisostearoyldiacryltitanate, isopropyltri(dioctylphosphate)titanate, isopropyltricumylphenyltitanate or tetraisopropylbis (dioctylphosphite)titanate, or the like, and these may be used either alone or as a combination of two or more.

The mixing amount of the coupling agent is preferably greater than or equal to 0.05 parts by mass and less than or equal to 5 parts by mass, and more preferably greater than or equal to 0.1 parts by mass and less than or equal to 2.5 parts by mass with regard to 100 parts by mass of the inorganic filler of (C) component. If the mixing amount is less than the lower limit, moisture resistance tends to be reduced, and if the mixing amount exceeds the upper limit, moldability of the package tends to be reduced.

In addition, well-known organic or inorganic compounds including a halogen atom, an antimony atom, a nitrogen atom or a phosphorus atom such as a brominated epoxy resin, antimony trioxide, antimony tetroxide or antimony pentoxide, flame retardants such as metal hydroxide, colorants such as carbon black, organic dyes, organic pigments, titanium oxide, red lead or red iron oxide, imidazole, triazole, tetrazole, triazine or the like, and derivatives thereof, anthranilic acid, gallic acid, malonic acid, malic acid, maleic acid, aminophenol, quinoline or the like and derivatives thereof, adhesion promoters such as aliphatic acid amide compounds, dithiocarbamates or thiadiazole derivatives, or the like, may be mixed into the epoxy resin composition for semiconductor encapsulant of the present invention as other additives, as necessary.

The epoxy resin composition for semiconductor encapsulant of the present invention may be prepared using any method as long as a variety of raw materials may be uniformly dispersed and mixed, however, as general methods, a method, in which after predetermined amounts of the raw materials are thoroughly mixed by a mixer or the like, the mixture is melted and kneaded by a mixing roll, a kneader, an extruder or the like, is cooled, and pulverized, may be included. It is easy to use if made as a tablet with dimensions and mass suitably fitted for the molding conditions.

In addition, the epoxy resin composition for semiconductor encapsulant of the present invention may be used as a liquid epoxy resin composition dissolved in a variety of organic solvents, or a sheet- or film-shaped epoxy resin composition, obtained by thinly coating this liquid epoxy resin composition on a plate or a film and distributing the organic solvent under the conditions that a curing reaction of the resin hardly progresses, may also be used.

Next, a semiconductor device of the present invention will be described. As the semiconductor device obtained by encapsulating the element by the epoxy resin composition for semiconductor encapsulant obtained by the present invention, a semiconductor device in which an element such as active elements such as semiconductor chips, transistors, diodes or thyristors, or passive elements such as capacitors, resistors or coils is mounted on a supporting member of the lead frame made of copper, and of which necessary parts are encapsulated with the epoxy resin composition for semiconductor encapsulant of the present invention may be included.

As the semiconductor device such as this, for example, general IC for resin encapsulant such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package) or TQFP (Thin Quad Flat Package) formed by being encapsulated by transfer molding and the like using the epoxy resin composition for semiconductor encapsulant of the present invention, after fixing the element on the lead frame made of copper and connecting the terminal part and the lead part of the element such as a bonding pad with a wire bonding or a bump. In addition, a package in which chips such as MCP (Multi Chip Stacked Package) are stacked in multiple stages may also be included.

FIG. 1 is a diagram showing a cross-sectional structure for one example of a semiconductor device using an epoxy resin composition for semiconductor encapsulant according to the present invention. Elements 1 are stacked in a two-stage and are fixed on a die pad 3 through a curing body of a die bonding material 2. An electrode pad of the element 1 and a lead frame made of copper 5 are connected by a bonding wire 4. The elements 1 are encapsulated by a curing body 6 of the resin composition for encapsulant.

As the method for encapsulating the element using the epoxy resin composition for semiconductor encapsulant of the present invention, a low-pressure transfer molding method is the most common method, however, an injection molding method, a compression molding method or the like, may also be used. If the epoxy resin composition for semiconductor encapsulant is a liquid phase or paste form at room temperature, a dispensing method, a casting method, a printing method, or the like may be included.

In addition to a general encapsulant method in which an element is directly resin encapsulated, a hollow package method in which an epoxy resin composition is not in direct contact with an element is also possible, and an epoxy resin composition for encapsulant for hollow package may also be suitably used.

EXAMPLES

Hereinafter, the present invention will be described in detail with reference to examples, however, the present invention is not limited to these.

Synthesis Example 1

Synthesis of a Compound 1 in which the Copolymer of 1-Alkene Having 28 to 60 Carbon Atoms and Maleic Anhydride is Esterified with Alcohol Having 18 Carbon Atoms Using p-Toluenesulfonic Acid 300 g of a copolymer of a mixture of 1-octacosene, 1-triacontene, 1-tetracontene, 1-pentacontene, 1-hexacontene and the like, and maleic anhydride (manufactured by Mitsubishi Chemical Corporation, trade name DIACARNA (registered trademark) 30), 140 g of stearyl alcohol (manufactured by Tokyo Kasei Co., Ltd.), and 4 g of p-toluenesulfonic acid-monohydrate (manufactured by Tokyo Kasei Co., Ltd.) were dissolved in 500 ml of toluene and were reacted for 8 hours at 110° C., then toluene was removed by heating the mixture in stages up to 160° C., and the solvent was removed while the reaction was carried out for 6 hours at 160° C. under reduced pressure, resulting in 436 g of the compound 1. As the molecular weight measured by gel permeation chromatography with polystyrene conversion using tetrahydrofuran as the eluent, the number-average molecular weight (Mn)=4100, the molecular weight distribution (Mw/Mn)=3.51, and a monoesterification ratio of the compound 1 calculated from the residual amount of unreacted stearyl alcohol was 100 mol %. From an area ratio of GPC, the amount of 1-alkene included in the compound 1 was 12%. An aliquot of the peak at 17.2 to 17.8 minutes of retention time in GPC was analyzed by $^1$H-NMR, IR and GC/MS, and it was confirmed that 2.0% by mass of octadecyl p-toluenesulfonate was included in the compound 1. In addition, the residual amount of unreacted stearyl alcohol was 1% by mass or less of the whole compound 1.

Synthesis Example 2

Synthesis of a Compound 2 in which the Copolymer of 1-Alkene Having 28 to 60 Carbon Atoms and Maleic Anhydride is Esterified with Alcohol Having 18 Carbon Atoms Using Benzenesulfonic Acid 428 g of the compound 2 with 100 mol % monoesterification ratio was obtained following the method described in Synthesis Example 1 except that 4 g of benzenesulfonic acid (manufactured by Tokyo Kasei Co., Ltd.) was used instead of p-toluenesulfonic acid. As the molecular weight measured by gel permeation chromatography with polystyrene conversion using tetrahydrofuran as the eluent, the number-average molecular weight (Mn)=4100, the molecular weight distribution (Mw/Mn)=3.72, 1.9% by mass of octadecyl benzenesulfonate was included, and the residual amount of unreacted stearyl alcohol was 1% by mass or less of the whole compound 2. From an area ratio of GPC, the amount of 1-alkene included in the compound 2 was 12%.

Synthesis Example 3

Synthesis of a Compound 3 in which the Copolymer of 1-Alkene Having 28 to 60 Carbon Atoms and Maleic Anhydride is Esterified with Alcohol Having 18 Carbon Atoms Using Trifluoromethanesulfonic Acid 438 g of the compound 3 with 100 mol % monoesterification ratio was obtained following the method described in Synthesis Example 1 except that 0.1 g of trifluoromethanesulfonic acid (manufactured by Tokyo Kasei Co., Ltd.) was used instead of p-toluenesulfonic acid. As the molecular weight measured by gel permeation chromatography with polystyrene conversion using tetrahydrofuran as the eluent, the number-average molecular weight (Mn)=4100, the molecular weight distribution (Mw/Mn)=3.53, 480 ppm of octadecyl trifluoromethanesulfonate was included, and the residual amount of unreacted stearyl alcohol was 1% or less of the whole compound 3. From an area ratio of GPC, the amount of 1-alkene included in the compound 3 was 14%.

Synthesis Example 4

Synthesis of a Compound 4 in which the Copolymer of 1-Alkene Having 28 to 60 Carbon Atoms and Maleic Anhydride is Esterified with Alcohol Having 10 Carbon Atoms Using p-Toluenesulfonic Acid 340 g of the compound 4 with 100 mol % monoesterification ratio was obtained following the method described in Synthesis Example 1 except that 68 g of 1-decanol (manufactured by Tokyo Kasei Co., Ltd.) was used instead of stearyl alcohol. As the molecular weight measured by gel permeation chromatography with polystyrene conversion using tetrahydrofuran as the eluent, the number-average molecular weight (Mn)=3700, the molecular weight distribution (Mw/Mn)=3.84, 1.7% of decyl p-toluenesulfonate was included, and the residual amount of unreacted 1-decanol was 1% or less of the whole compound 4. From an area ratio of GPC, the amount of 1-alkene included in the compound 4 was 12%.

Synthesis Example 5

Synthesis of a Compound 5 in which the Copolymer of 1-Alkene Having 28 to 60 Carbon Atoms and Maleic Anhydride is Esterified with Alcohol Having 22 Carbon Atoms Using p-Toluenesulfonic Acid 340 g of the compound 5 with 100 mol % monoesterification ratio was obtained following the method described in Synthesis Example 1 except that 170 g of behenyl alcohol (manufactured by Kao Corporation) was used instead of stearyl alcohol. As the molecular weight measured by gel permeation chromatography with polystyrene conversion using tetrahydrofuran as the eluent, the number-average molecular weight (Mn)=4400, the molecular weight distribution (Mw/Mn)=3.85, 2.1% of behenyl p-toluenesulfonate was included, and the residual amount of unreacted behenyl alcohol was 1% or less of the whole compound 5. From an area ratio of GPC, the amount of 1-alkene included in the compound 5 was 12%.

Synthesis Example 6

Synthesis of a Compound 6 in which the Copolymer of 1-Alkene Having 20 to 24 Carbon Atoms and Maleic Anhydride is Esterified with Alcohol Having 18 Carbon Atoms Using p-Toluenesulfonic Acid 180 g of a mixture of 1-eicosene, 1-docosene and 1-tetracosene (manufactured by Idemitsu Kosan Co., Ltd., trade name LINEALENE 2024), and 58 g of maleic anhydride were dissolved in 500 ml of toluene and 0.16 g of benzoyl peroxide (BPO) was added in three installments every 20 minutes while heating at 110° C. After the completion of BPO addition, the reaction solution was further heated for 7 hours at 110° C. 160 g of stearyl alcohol and 4.0 g of p-toluenesulfonic acid were added to the toluene solution of 235 g of this copolymer, and the mixture was reacted for 8 hours at 110° C., then toluene was removed by heating the mixture in stages up to 160° C., and unreacted components were removed while the reaction was carried out for 6 hours at 160° C. under reduced pressure, resulting in 380 g of the compound 6 with 100 mol % monoesterification ratio. As the molecular weight measured by gel permeation chromatography with polystyrene conversion using tetrahydrofuran as the eluent, the number-average molecular weight (Mn)=9800, the molecular weight distribution (Mw/Mn)=2.66, 2.3% of octadecyl p-toluenesulfonate was included, and the residual amount of unreacted stearyl alcohol was 1% or less of the whole compound 6. From an area ratio of GPC, the amount of 1-alkene included in the compound 6 was 12%.

Synthesis Example 7

Synthesis of a Compound 7 in which the Copolymer of 1-Alkene Having 28 to 60 Carbon Atoms and Maleic Anhydride is Esterified with Alcohol Having 18 Carbon Atoms Using p-Toluenesulfonic Acid (Addition Amount: Decreased)

340 g of the compound 7 with 85 mol % monoesterification ratio was obtained following the method described in Synthesis Example 1 except that the addition amount of p-toluenesulfonic acid was changed to 2 g. As the molecular weight measured by gel permeation chromatography with polystyrene conversion using tetrahydrofuran as the eluent, the number-average molecular weight (Mn)=4000, the molecular weight distribution (Mw/Mn)=3.87, 1.0% of octadecyl p-toluenesulfonate was included, and the residual amount of unreacted stearyl alcohol was 5% of the whole compound 7. From an area ratio of GPC, the amount of 1-alkene included in the compound 7 was 12%.

Synthesis Example 8

Synthesis of a Compound 8 in which the Copolymer of 1-Alkene Having 28 to 60 Carbon Atoms and Maleic Anhydride is Esterified with Alcohol Having 18 Carbon Atoms Using p-Toluenesulfonic Acid (Addition Amount: Increased)

340 g of the compound 8 with 85 mol % monoesterification ratio was obtained following the method described in Synthesis Example 1 except that the addition amount of p-toluenesulfonic acid was changed to 8 g. As the molecular weight measured by gel permeation chromatography with polystyrene conversion using tetrahydrofuran as the eluent, the number-average molecular weight (Mn)=4100, the molecular weight distribution (Mw/Mn)=3.88, 4.0% of octadecyl p-toluenesulfonate was included, and the residual amount of unreacted stearyl alcohol was 1% or less of the whole compound 8. From an area ratio of GPC, the amount of 1-alkene included in the compound 8 was 12%.

Synthesis Example 9

Synthesis of a Compound 9 in which the Copolymer of 1-Alkene Having 20 to 24 Carbon Atoms and Maleic Anhydride is Esterified with Alcohol Having 18 Carbon Atoms without Using a Catalyst 380 g of the compound 9 with 75 mol % monoesterification ratio was obtained following the method described in Synthesis Example 6 except that p-toluenesulfonic acid which is an esterification catalyst was not added. As the molecular weight measured by gel permeation chromatography with polystyrene conversion using tetrahydrofuran as the eluent, the number-average molecular weight (Mn)=9300, the molecular weight distribution (Mw/Mn)=2.62, and the residual amount of unreacted stearyl alcohol was 7% of the whole compound 9. From an area ratio of GPC, the amount of 1-alkene included in the compound 9 was 12%.

Synthesis Example 10 below allowed investigation of the effects of reducing sulfonate and the like by changing the removing method of the esterification catalyst residue of Synthesis Example 3.

Synthesis Example 10

300.0 g of the copolymer of 1-alkene having 28 to 60 carbon atoms and maleic anhydride and 141 g of stearyl alcohol were melted at 70° C., and then, 1 g of 10 wt % aqueous solution of trifluoromethanesulfonic acid was added. The reaction mixture obtained was stirred for 5 hours at 150° C.

After that, the liquid was cooled to a temperature of 120° C., and free trifluoromethanesulfonic acid and water were removed by distilling the liquid under reduced pressure for 3 hours with a reduced pressure of 30 Torr, resulting in 435 g of a compound 10. The compound 10 included 480 ppm of the octadecyl trifluoromethanesulfonate. From an area ratio of GPC, the amount of 1-alkene included in the compound 10 was 14%.

Synthesis Example 11 below allowed investigation of the effects of reducing sulfonate and the like by introducing a step for removing the esterification catalyst of Synthesis Example 1 by solvent cleaning.

Synthesis Example 11

300.0 g of the copolymer of 1-alkene having 28 to 60 carbon atoms and maleic anhydride and 141 g of stearyl alcohol were melted at 70° C. Then, 4 g of p-toluenesulfonic acid-monohydrate was added, and the mixture was stirred for 8 hours at 150° C. The reaction mixture obtained was cooled to 80° C., and 500 g of acetone was added dropwise over 60 minutes under reflux. After the completion of dropwise addition, stirring was stopped and the mixture was allowed to stand for 60 minutes at a liquid temperature of 70° C., resulting in separation of the reaction mother liquor into two layers. The acetone layer of an upper layer including unreacted stearyl alcohol and sulfonic acid component was removed. After this washing operation was repeated twice, remaining acetone was removed by distilling the remaining lower layer under reduced pressure for 6 hours at 90° C. with a reduced pressure of 30 Torr, resulting in 420 g of a compound 11 containing 600 ppm of octadecyl p-toluenesulfonate. From an area ratio of GPC, the amount of 1-alkene included in the compound 11 was 9%.

Synthesis Example 12 below allowed investigation of the effects of reducing low molecular weight components including 1-alkene by excessively repeating the solvent cleaning step of Synthesis Example 11.

Synthesis Example 12

300.0 g of the copolymer of a 1-alkene having 28 to 60 carbon atoms and maleic anhydride and 141 g of stearyl alcohol were melted at 70° C. Then, 4 g of p-toluenesulfonic acid-monohydrate was added, and the mixture was stirred for 8 hours at 150° C. The reaction mixture obtained was cooled to 80° C., and 500 g of acetone was added dropwise over 60 minutes under reflux. After the completion of dropwise addition, stirring was stopped and the mixture was allowed to stand for 60 minutes at a liquid temperature of 70° C., resulting in separation of the reaction mother liquid into two layers. The acetone layer of an upper layer including unreacted stearyl alcohol and sulfonic acid component was removed. After this washing operation was repeated five times, remaining acetone was removed by distilling the remaining lower layer under reduced pressure for 6 hours at 90° C. with reduced pressure of 30 Torr, resulting in 390 g of a compound 12 containing 300 ppm of octadecyl p-toluenesulfonate. From an area ratio of GPC, the amount of 1-alkene included in the compound 12 was 3%.

The components used in Examples 1 to 14 and Comparative Example 1 are shown below.

Epoxy Resin of (A) Component:

Epoxy resin 1: epoxy equivalent of 185 g/eq, biphenyl-type epoxy resin with a melting point of 108° C. (manufactured by Japan Epoxy Co., Ltd. trade name EPICOAT YX-4000K)

Epoxy resin 2: epoxy equivalent of 237 g/eq, phenol aralkyl-type epoxy resin having a phenylene skeleton with a softening point of 52° C. (manufactured by Nippon Kayaku Co., Ltd. trade name NC2000)

Epoxy resin 3: epoxy equivalent of 273 g/eq, phenol aralkyl-type epoxy resin having a biphenylene skeleton with a softening point of 52° C. (manufactured by Nippon Kayaku Co., Ltd. trade name NC-3000L)

Epoxy resin 4: epoxy equivalent of 220 g/eq, ortho-cresol novolac-type epoxy resin with a softening point of 52° C. (manufactured by Nippon Kayaku Co., Ltd. trade name EOCN-104S)

Curing Agent of (B) Component:

Phenol resin-based curing agent 1: hydroxyl equivalent of 199 g/eq, phenol aralkyl-type phenol resin having a biphenylene skeleton with a softening point of 64° C. (manufactured by Meiwa Kasei Co., Ltd. trade name MEH-7851SS)

Inorganic Filler of (C) Component:

Inorganic filler 1: spherical fused silica with an average particle size of 10.8 μm and a specific surface area of 5.1 $m^2/g$ Component (D):

Compound 1: the compound 1 obtained in Synthesis Example 1

Compound 2: the compound 2 obtained in Synthesis Example 2

Compound 3: the compound 3 obtained in Synthesis Example 3

Compound 4: the compound 4 obtained in Synthesis Example 4

Compound 5: the compound 5 obtained in Synthesis Example 5

Compound 6: the compound 6 obtained in Synthesis Example 6

Compound 7: the compound 7 obtained in Synthesis Example 7

Compound 8: the compound 8 obtained in Synthesis Example 8

Compound 9: the compound 9 obtained in Synthesis Example 9

Compound 10: the compound 10 obtained in Synthesis Example 10

Compound 11: the compound 11 obtained in Synthesis Example 11

Compound 12: the compound 12 obtained in Synthesis Example 12

Curing Accelerator:

Curing accelerator 1: adduct of triphenylphosphine and p-benzoquinone

Other Additives:

Coupling agent 1: γ-glycidoxypropyltrimethoxysilane (manufactured by Chisso Corporation trade name S510=GPS-M)

Colorant 1: carbon black (manufactured by Mitsubishi Chemical Corporation trade name carbon #5)

Examples 1 to 14 and Comparative Example 1

The epoxy resin composition was prepared by mixing the above components in parts by mass shown in Table 1 and Table 2, respectively, biaxially kneading under the conditions of a kneading temperature of 100° C. and a kneading time for 30 minutes, cooling, and then pulverizing.

The epoxy resin compositions prepared in the Examples and the Comparative Example were evaluated by each of the following tests. Evaluation results are shown in Table 1 and Table 2.

Adhesion to Copper Oxide:

A copper oxide substrate oxidized by heating on a heat panel board for 2 minutes at 220° C. and the epoxy resin composition made as a tablet were integrally molded under the conditions of 175° C., 6.9 MPa and for 2 minutes, and, a truncated cone-shaped molded product (upper diameter 3 mm×lower diameter 3.6 mm×thickness 3 mm, and the contact area of 10 $mm^2$ between the copper oxide substrate and the cured resin) was obtained on the copper oxide substrate (a diameter of 3.6 mm and a thickness of 0.5 mm), and then, the substrate of each molded product obtained was fixed, cured site of the epoxy resin composition was pressed from the horizontal direction and torque (N) was measured. The evaluation has a correlation with solder reflowing resistance in a semiconductor to some extent, and as a result of the determination, 14 N or more was made to be ©, greater than or equal to 12 N and less than 14 N was made to be ○, and less than 12 N was made to be x.

Figure 2:
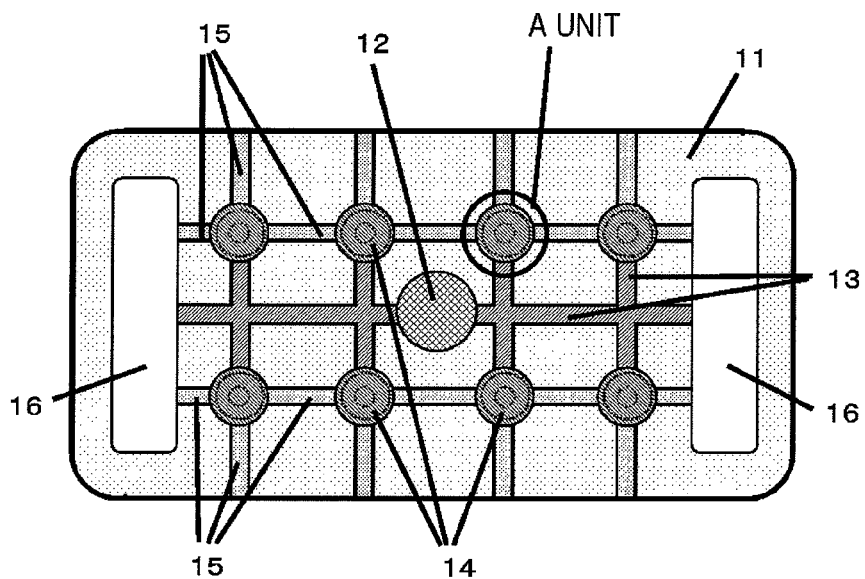
FIG. 2 is a schematic diagram when seen in a plan view showing a state of an intermediate mold after molding in a mold for evaluation in order to evaluate the load when the epoxy resin composition for semiconductor encapsulant according to the present invention is released.
Figure 3:
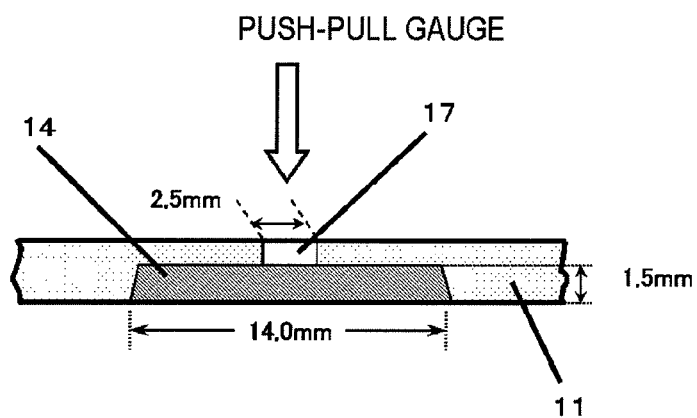
FIG. 3 is a schematic diagram showing a cross-sectional structure of an A unit near a molded product of the intermediate mold of FIG. 2.

Mold Releasing Load:

A mold for load evaluation at the time of a mold releasing is made of an upper mold, an intermediate mold, and a lower mold as a transfer mold type. A schematic diagram when seen in a plan view of an intermediate mold after molding is shown in FIG. 2 and a schematic diagram showing a cross-sectional structure of an A unit of FIG. 2 is shown in FIG. 3, respectively. The shape of the molded product attached to the intermediate mold after molding is a diameter of 14.0 mm and a height of 1.5 mm thickness. In FIGS. 2 and 3, 11 represents an intermediate mold, 12 represents a Cal, and 13 represents a runner. 14 represents the molded product and 15 represents an air vent. 16 represents a handle and 17 represents a hole for push-pull gauge insert, respectively.

The epoxy resin composition was injected into the mold for load evaluation at the time of a mold releasing using a low pressure transfer molding machine (manufactured by TOWA Co., Ltd., Y-series manual press) under the conditions of a mold temperature of 175° C., an injection pressure of 6.9 MPa and a curing time of 60 seconds, and the molded product 14 of 8 pieces/shot was transfer molded. After the molding, the push-pull gauge from the hole 17 at the top of the intermediate mold relied on the circular molded product 14 attached to the intermediate mold 11 after molding (see FIG. 3), and the load applied when the molded product was pushed was measured. Continuously, the materials for evaluation were molded in 20 shots and the measurement was carried out on the molded product of the latter 10 shots, and the average value was shown as the mold releasing load. The evaluation has a correlation with stable productivity of mass production molding to some extent, and as a result of the determination, 15 N or less was made to be ©, greater than 15 N and less than 20 N was made to be ○, and 20 N or more was made to be x.

Continuous Moldability (Air Vent Block and Mold Stain):

The chip and the like were encapsulated by the epoxy resin composition using an automatic low-pressure transfer molding machine (manufactured by Dai-Ichi Seiko Co., Ltd. GP-ELF) under the conditions of a mold temperature of 175° C., an injection pressure of 9.8 MPa and a curing time of 70 seconds, and a molding obtaining a 80-pin quad flat package (80pQFP: a lead frame made of copper, an outer dimension of the package: 14 mm×20 mm×2 mm thickness, a pad size: 6.5 mm×6.5 mm, and a chip size: 6.0 mm×6.0 mm×0.35 mm thickness) was carried out up to 400 shots continuously.

Evaluation of the air vent block was performed by visually observing the mold every 50 shots, checking the presence of air vent block (a state in which the resin cured product adheres to the air vent block (a width of 0.5 mm and a thickness of 50 μm) unit and blocks the air vent), and evaluation was performed by the following four stages. Order of preference was A, B, and C . . . however, C or above is a practically possible range. Evaluation results are shown below.

A: No problems occurred up to 400 shots
B: The air vent block occurred up to 300 shots
C: The air vent block occurred up to 200 shots
D: The air vent block occurred up to 100 shots For the mold stain, the mold was observed after 400 shot molding, and was evaluated by the following five stages from the extent of spread of the stain from the gate entry. Order of preference was A, B, and C . . . , however, C or above is a practically possible range.

A: No stain occurs

B: Spread of stain was 20 area % or less of the cavity surface

C: Spread of stain was greater than 20 area % and less than or equal to 40 area % of the cavity surface D: Spread of stain was greater than 40 area % and less than or equal to 60 area % of the cavity surface E: Spread of stain was greater than 60 area % of the cavity surface Molding of PKG for Au Wire Reliability Test:

Moisture resistance reliability: TEG chip which forms an aluminum circuit (3 mm×3.5 mm, the aluminum circuit was exposed without a protective film) was attached onto a die pad of a 16-pin SOP lead frame (package size is 7.2 mm×11.5 mm, thickness is 1.95 mm), and an aluminum pad and a substrate-side terminal was wire bonded with a wire pitch of 80 μm using an Au wire (a wire diameter of 25 μm and purity of 99.99%). This was encapsulant molded by the epoxy resin composition using a low pressure transfer molding machine (manufactured by Kotaki Seiki Co., Ltd., KTS-125) under the conditions of a mold temperature of 175° C., an injection pressure of 9.8 MPa and a curing time of 2 minutes, and the 16-pin SOP package was prepared. The package prepared was post-cured at 175° C. for 4 hours.

Molding of PKG for Cu Wire Reliability Test:

Moisture resistance reliability: TEG chip which forms an aluminum circuit (3.5 mm×3.5 mm, the aluminum circuit was exposed without a protective film) was attached onto a die pad of a 16-pin SOP lead frame (package size is 7.2 mm×11.5 mm, thickness is 1.95 mm), and an aluminum pad and a substrate-side terminal was wire bonded with a wire pitch of 80 μm using a Cu wire (a wire diameter of 25 μm and purity of 99.99%). This was encapsulant molded by the epoxy resin composition using a low pressure transfer molding machine (manufactured by Kotaki Seiki Co., Ltd., KTS-125) under the conditions of a mold temperature of 175° C., an injection pressure of 9.8 MPa and a curing time of 2 minutes, and the 16-pin SOP package was prepared. The package prepared was post-cured at 175° C. for 4 hours.

Moisture Resistance Reliability Test:

A HAST (Highly Accelerated temperature and humidity Stress Test) test was carried out in accordance with IEC68-2-66 using the package prepared. The presence of open defects of the circuit was measured under the test conditions of 130° C., 85% RH, an applying voltage of 20 V for 240 hours (480 hours if Cu wire is used). Results are shown as the number of defects among 15 packages.

Soldering Resistance Test:

A lead frame and the like in which a semiconductor element (a silicon chip) was mounted was set on the mold at 180° C. in order to reproduce the oxidation state using a low pressure transfer machine (manufactured by Dai-Ichi Seiko Co., Ltd. GP-ELF), and was preheated for 2 minutes, and then, the epoxy resin composition was injected under the conditions of a mold temperature of 180° C., an injection pressure of 7.4 MPa and a curing time of 120 seconds, and a semiconductor device of 80pQFP (a lead frame made of copper, the size is 14×20 mm×thickness 2.00 mm, the semiconductor element is 7×7 mm×thickness 0.35 mm, the semiconductor element and the inner lead unit of the lead frame were bonded with a gold line with a diameter of 25 μm) was prepared by encapsulant molding the lead frame and the like in which the semiconductor element (the silicon chip) was mounted. The twelve semiconductor devices heat-treated for 4 hours at 175° C. as a post-cure was humidification treated for 120 hours at 60° C. and a relative humidity of 60%, and then an IR reflow treatment (260° C., according to conditions of JEDEC.Level 3) was performed. The presence of peeling and cracks of the inside of these semiconductor devices were observed using an ultrasonic flaw detector (manufactured by Hitachi Kenki FineTech Co., Ltd. mi-scope10) and those in which even any one of the peeling or the cracks occurred were considered to be defects. The results are shown as the number of defective semiconductor devices among n=6. If the number of defects is 1 or less, it is considered to be in a practically possible range.

TABLE 1

| | | Examples | | | | | | |
|---|---|---|---|---|---|---|---|---|
| | | 1 | 2 | 3 | 4 | 5 | 6 | 7 |
| Composition of Epoxy Resin Composition [Parts By Mass] | Epoxy Resin 1 | 3.01 | 3.01 | 3.01 | 3.01 | 3.01 | 3.01 | 3.01 |
| | Epoxy Resin 2 | 3.01 | 3.01 | 3.01 | 3.01 | 3.01 | 3.01 | 3.01 |
| | Epoxy Resin 3 | | | | | | | |
| | Epoxy Resin 4 | | | | | | | |
| | Phenol Resin-based Curing Agent 1 | 5.18 | 5.18 | 5.18 | 5.18 | 5.18 | 5.18 | 5.18 |
| | Inorganic Filler 1 | 88 | 88 | 88 | 88 | 88 | 88 | 88 |
| | Compound 1 | 0.20 | | | | | | |
| | Compound 2 | | 0.20 | | | | | |
| | Compound 3 | | | 0.20 | | | | |
| | Compound 4 | | | | 0.20 | | | |
| | Compound 5 | | | | | 0.20 | | |
| | Compound 6 | | | | | | 0.20 | |
| | Compound 7 | | | | | | | 0.20 |
| | Compound 8 | | | | | | | |
| | Compound 9 | | | | | | | |
| | Compound 10 | | | | | | | |
| | Compound 11 | | | | | | | |
| | Compound 12 | | | | | | | |
| | Curing Accelerator 1 | 0.27 | 0.27 | 0.27 | 0.27 | 0.27 | 0.27 | 0.27 |
| | Coupling Agent 1 | 0.03 | 0.03 | 0.03 | 0.03 | 0.03 | 0.03 | 0.03 |
| | Colorant 1 | 0.30 | 0.30 | 0.30 | 0.30 | 0.30 | 0.30 | 0.30 |
| Content of Compound Represented by General | Octadecyl p-Toluenesulfonate | 0.004 | | | | | 0.0047 | 0.002 |
| | Octadecyl Benzenesulfonate | | 0.0039 | | | | | |

TABLE 1-continued

|  |  | Examples | | | | | | |
| --- | --- | --- | --- | --- | --- | --- | --- | --- |
|  |  | 1 | 2 | 3 | 4 | 5 | 6 | 7 |
| Formula (2) in the Resin Composition [% by Mass] | Octadecyl Trifluoromethanesulfonate |  |  | 0.0001 |  |  |  |  |
|  | Decyl p-Toluenesulfonate |  |  |  | 0.0035 |  |  |  |
|  | Behenyl p-Toluenesulfonate |  |  |  |  | 0.0043 |  |  |
| Evaluation Results | Adhesion to Copper Oxide (N) | 15 | 15 | 14 | 15 | 13 | 13 | 14 |
|  | Decision | ⊚ | ⊚ | ⊚ | ⊚ | ○ | ○ | ⊚ |
|  | Mold Releasing Load (N) | 17 | 18 | 14 | 19 | 13 | 20 | 16 |
|  | Decision | ○ | ○ | ⊚ | ○ | ⊚ | x | ○ |
|  | Continuous Moldability — Air Vent Block | B | A | A | B | A | B | B |
|  | Continuous Moldability — Mold Stain | A | B | A | A | A | A | B |
|  | Au Wire Moisture Resistance Reliability (Defects Among 15 Pieces) | 1 | 0 | 0 | 0 | 0 | 0 | 0 |
|  | Cu Wire Moisture Resistance Reliability (Defects Among 15 Pieces) | 1 | 1 | 0 | 1 | 1 | 1 | 1 |
|  | Soldering Resistance (Defects Among 12 Pieces) | 0 | 0 | 0 | 0 | 1 | 0 | 1 |

TABLE 2

|  |  | Examples | | | | | | | Comparative Example |
| --- | --- | --- | --- | --- | --- | --- | --- | --- | --- |
|  |  | 8 | 9 | 10 | 11 | 12 | 13 | 14 | 1 |
| Composition of Epoxy Resin Composition [Parts By Mass] | Epoxy Resin 1 | 3.01 | 5.69 |  | 2.97 | 3.01 | 3.01 | 3.01 | 3.01 |
|  | Epoxy Resin 2 | 3.01 |  |  |  | 3.01 | 3.01 | 3.01 | 3.01 |
|  | Epoxy Resin 3 |  |  | 6.80 |  |  |  |  |  |
|  | Epoxy Resin 4 |  |  |  | 2.97 |  |  |  |  |
|  | Phenol Resin-based Curing Agent 1 | 5.18 | 5.49 | 4.44 | 5.27 | 5.18 | 5.18 | 5.18 | 5.18 |
|  | Inorganic Filler 1 | 88 | 88 | 88 | 88 | 88 | 88 | 88 | 88 |
|  | Compound 1 |  | 0.20 | 0.20 | 0.20 |  |  |  |  |
|  | Compound 2 |  |  |  |  |  |  |  |  |
|  | Compound 3 |  |  |  |  |  |  |  |  |
|  | Compound 4 |  |  |  |  |  |  |  |  |
|  | Compound 5 |  |  |  |  |  |  |  |  |
|  | Compound 6 |  |  |  |  |  |  |  |  |
|  | Compound 7 |  |  |  |  |  |  |  |  |
|  | Compound 8 | 0.20 |  |  |  |  |  |  |  |
|  | Compound 9 |  |  |  |  |  |  |  | 0.20 |
|  | Compound 10 |  |  |  |  | 0.20 |  |  |  |
|  | Compound 11 |  |  |  |  |  | 0.20 |  |  |
|  | Compound 12 |  |  |  |  |  |  | 0.20 |  |
|  | Curing Accelerator 1 | 0.27 | 0.29 | 0.23 | 0.27 | 0.27 | 0.27 | 0.27 | 0.27 |
|  | Coupling Agent 1 | 0.03 | 0.03 | 0.03 | 0.03 | 0.03 | 0.03 | 0.03 | 0.03 |
|  | Colorant 1 | 0.30 | 0.30 | 0.30 | 0.30 | 0.30 | 0.30 | 0.30 | 0.30 |
| Content of Compound Represented by General Formula (2) in the Resin Composition [% by Mass] | Octadecyl p-Toluenesulfonate | 0.008 | 0.004 | 0.004 | 0.004 |  | 0.00012 | 0.00006 |  |
|  | Octadecyl Benzenesulfonate |  |  |  |  |  |  |  |  |
|  | Octadecyl Trifluoromethanesulfonate |  |  |  |  | 0.0001 |  |  |  |
|  | Decyl p-Toluenesulfonate |  |  |  |  |  |  |  |  |
|  | Behenyl p-Toluenesulfonate |  |  |  |  |  |  |  |  |
| Evaluation Results | Adhesion to Copper Oxide (N) | 17 | 14 | 14 | 14 | 14 | 14 | 17 | 10 |
|  | Decision | ⊚ | ⊚ | ⊚ | ⊚ | ⊚ | ⊚ | ⊚ | x |
|  | Mold Releasing Load (N) | 19 | 16 | 16 | 17 | 14 | 16 | 20 | 20 |
|  | Decision | ○ | ○ | ○ | ○ | ⊚ | ○ | x | x |
|  | Continuous Moldability — Air Vent Block | B | A | A | A | A | B | C | D |
|  | Continuous Moldability — Mold Stain | B | A | A | A | A | A | A | B |
|  | Au Wire Moisture Resistance Reliability (Defects Among 15 Pieces) | 1 | 0 | 0 | 0 | 0 | 0 | 0 | 0 |
|  | Cu Wire Moisture Resistance Reliability (Defects Among 15 Pieces) | 5 | 1 | 1 | 1 | 0 | 0 | 0 | 0 |
|  | Soldering Resistance (Defects Among 12 Pieces) | 0 | 0 | 0 | 0 | 0 | 0 | 0 | 4 |

Examples 1 to 14 include (A) the epoxy resin, (B) the curing agent, (C) the inorganic filler, and (D) the compound in which a copolymer of 1-alkene and maleic anhydride is esterified with an alcohol using a compound represented by General Formula (1), and include those in which the types of the (A) compound, and the types and the mixing amounts of the component (D) are changed. In all Examples 1 to 14, results were obtained in which adhesive strength to the copper oxide was high, and soldering resistance by the IR reflow treatment after the humidification treatment using the lead frame made of copper in which oxidation has progressed was excellent. In particular, in all Examples 1 to 13, results were obtained in which mold releasing load was low, and continuous moldability (air vent block and mold stain) when encapsulant molding the elements and the like, or moisture resistance reliability was excellent.

Among these, in Examples 1, 9, 10, and 11 which used, as the (A) component, one or more resin of the epoxy resin 1 which is a biphenyl-type epoxy resin represented by General Formula (5), the epoxy resin 2 which is a phenol aralkyl-type epoxy resin having a phenylene skeleton represented by General Formula (6) and the epoxy resin 3 which is a phenol aralkyl-type epoxy resin having a biphenylene skeleton represented by General Formula (7) in an amount of 50% by mass or more with regard to the total amount of the (A) component, and, as the (D) component, the compound 1 in which the copolymer of 1-alkene having 28 to 60 carbon atoms and maleic anhydride was esterified with the alcohol having 18 carbon numbers using p-toluenesulfonic acid, results with an excellent balance of adhesive strength to the copper oxide, moisture resistance reliability, soldering resistance and mold releasing property (mold releasing load), and continuous moldability (air vent block and mold stain) were obtained. Example 12 which used Compound 10 containing the same amount of octadecyl trifluoromethanesulfonate as Compound 3 had same characteristics as Example 3, although the methods for removing catalyst residue were different. In example 13 which used Compound 11 in which the catalyst residue was reduced by adding a solvent cleaning step, Cu wire moisture resistance reliability was improved compared to that of Example 1.

On the other hand, in Comparative Example 1 which used Compound 9 in which the copolymer of 1-alkene having 20 to 24 carbon atoms and maleic anhydride was esterified with the alcohol having 18 carbon numbers without using a catalyst, moisture resistance reliability was satisfactory, however, adhesive strength to the copper oxide, soldering resistance, mold releasing load, and mold stain and air vent block of continuous moldability were inferior. In Example 14 which used compound 12 containing a small content of 1-alkene, moisture resistance reliability, adhesive strength to the copper oxide and soldering resistance were satisfactory, however, air vent block of continuous moldability and mold releasing load were inferior.

According to the present invention, as shown in Examples, an epoxy resin composition for semiconductor encapsulant with excellent adhesion to a lead frame made of copper in which oxidation has progressed, an excellent mold releasing property and continuous moldability and the like may be obtained, therefore, this epoxy resin composition may be suitably used for electronic components such as IC and LSI, particularly, a package in which oxidation of a lead frame made of copper easily progresses such as MCP (Multi Chip Stacked Package) in which chips are stacked in multiple stages.

The invention claimed is:
1. An epoxy resin composition for semiconductor encapsulant, comprising:
(A) an epoxy resin;
(B) a curing agent;
(C) an inorganic filler; and
(D) a compound in which a copolymer of a 1-alkene having 5 to 80 carbon atoms and maleic anhydride is esterified with an alcohol having 5 to 25 carbon atoms in the presence of a compound represented by General Formula (1),

(wherein, in General Formula (1), $R^1$ is selected from the group consisting of an alkyl group having 1 to 5 carbon atoms, a halogenated alkyl group having 1 to 5 carbon atoms, and an aromatic group having 6 to 10 carbon atoms).

2. The epoxy resin composition according to claim 1, further comprising:
a 1-alkene having 5 to 58 carbon atoms.

3. The epoxy resin composition according to claim 2,
wherein the amount of the 1-alkene having 5 to 58 carbon atoms is greater than or equal to 8 parts by mass and less than or equal to 20 parts by mass with regard to 100 parts by mass of the (D) component.

4. The epoxy resin composition according to claim 1, further comprising:
a compound represented by General Formula (2),

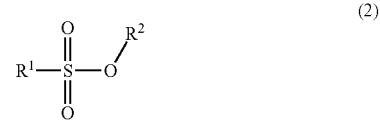

(wherein, in General Formula (2), $R^1$ is selected from the group consisting of an alkyl group having 1 to 5 carbon atoms, a halogenated alkyl group having 1 to 5 carbon atoms and an aromatic group having 6 to 10 carbon atoms, and $R^2$ represents an alkyl group having 5 to 25 carbon atoms).

5. The epoxy resin composition according to claim 4,
wherein the amount of the compound represented by General Formula (2) included in the whole epoxy resin composition is greater than or equal to 0.5 ppm and less than or equal to 100 ppm.

6. The epoxy resin composition according to claim 1,
wherein the compound represented by General Formula (1) is trifluoromethanesulfonic acid.

7. The epoxy resin composition according to claim 1,
wherein the compound represented by General Formula (1) is a compound represented by General Formula (3),

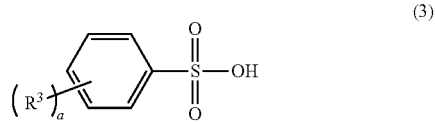

(in General Formula (3), $R^3$'s are selected from an alkyl group having 1 to 5 carbon atoms and a halogenated alkyl group having 1 to 5 carbon atoms, and may be the same as or different from each other, and a is an integer of 0 to 5).

8. The epoxy resin composition according to claim 4, wherein the compound represented by General Formula (2) is a compound represented by General Formula (4),

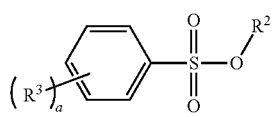
(4)

(in General Formula (4), $R^2$ represents an alkyl group having 5 to 25 carbon atoms, $R^3$'s are selected from an alkyl group having 1 to 5 carbon atoms and a halogenated alkyl group having 1 to 5 carbon atoms, and may be the same as or different from each other, and a is an integer of 0 to 5).

9. The epoxy resin composition according to claim 1, wherein the 1-alkene is a 1-alkene having 28 to 60 carbon atoms.

10. The epoxy resin composition according to claim 1, wherein the alcohol is stearyl alcohol.

11. The epoxy resin composition according to claim 1, wherein the (A) the epoxy resin includes at least one epoxy resin selected from the group consisting of a biphenyl-type epoxy resin represented by General Formula (5), a phenol aralkyl-type epoxy resin having a phenylene skeleton represented by General Formula (6), and a phenol aralkyl-type epoxy resin having a biphenylene skeleton represented by General Formula (7),

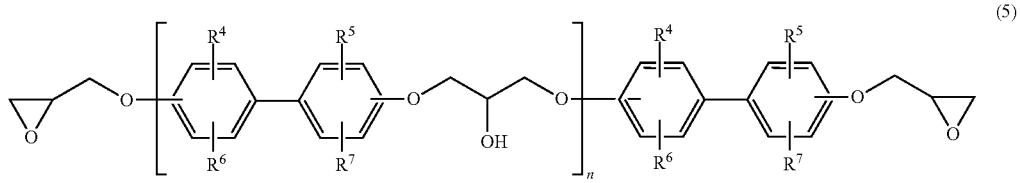
(5)

(in General Formula (5), $R^4$ to $R^7$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^4$ to $R^7$ may be the same as or different from each other, and n represents an integer of 0 to 3),

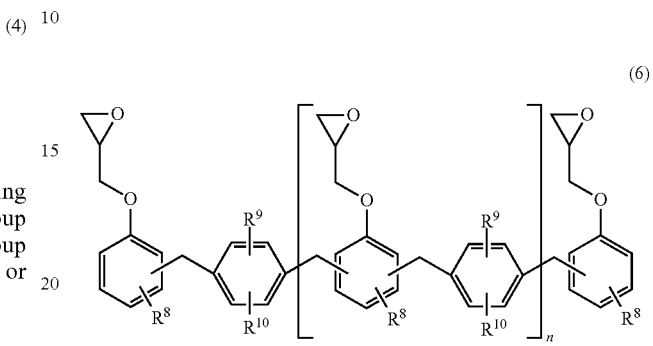
(6)

(in General Formula (6), $R^8$ to $R^{10}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^8$ to $R^{10}$ may be the same as or different from each other, and n represents an integer of 0 to 20),

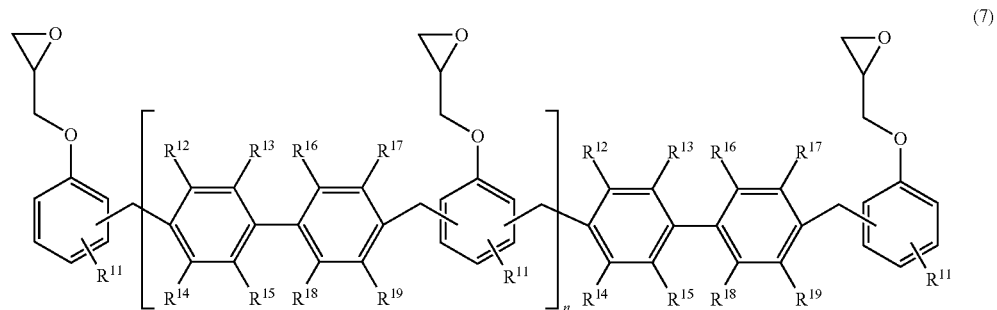
(7)

(in General Formula (7), $R^{11}$ to $R^{19}$ are selected from the group consisting of a hydrogen atom, an alkyl group having 1 to 10 carbon atoms, an alkoxy group having 1 to 10 carbon atoms, an aryl group having 6 to 10 carbon atoms and an aralkyl group having 6 to 10 carbon atoms, $R^{11}$ to $R^{19}$ may be the same as or different from each other, and n represents an integer of 0 to 3).

12. A semiconductor device, comprising:
a semiconductor element encapsulated by the epoxy resin composition according to claim 1.

13. The semiconductor device according to claim 12, wherein the semiconductor element is mounted on a die pad of a lead frame made of copper, and an electrode pad of the semiconductor element and an inner lead of the lead frame made of copper are connected by a bonding wire.

14. The semiconductor device according to claim 13, wherein two or more of the semiconductor elements are mounted by being stacked on the die pad of the lead frame made of copper.

\* \* \* \* \*